(12) United States Patent
Dalal et al.

(10) Patent No.: US 10,064,303 B2
(45) Date of Patent: Aug. 28, 2018

(54) INTEGRATED WIRING SYSTEM FOR COMPOSITE STRUCTURES

(71) Applicant: The Boeing Company, Chicago, IL (US)

(72) Inventors: Hardik Dalal, Seattle, WA (US); Jeffrey Lynn Duce, Maple Valley, WA (US); Yelina Rosillo, Edmonds, WA (US); Brent A. Robbins, Snohomish, WA (US); Breana K. Merriweather, Gilbert, AZ (US)

(73) Assignee: The Boeing Company, Chicago, IL (US)

( * ) Notice: Subject to any disclaimer, the term of this patent is extended or adjusted under 35 U.S.C. 154(b) by 486 days.

(21) Appl. No.: 14/282,248

(22) Filed: May 20, 2014

(65) Prior Publication Data

US 2015/0342077 A1    Nov. 26, 2015

(51) Int. Cl.
| | |
|---|---|
| *H05K 7/06* | (2006.01) |
| *C23C 4/08* | (2016.01) |
| *H05K 1/02* | (2006.01) |
| *B64D 45/00* | (2006.01) |
| *C23C 4/01* | (2016.01) |
| *C23C 4/134* | (2016.01) |
| *H05K 3/14* | (2006.01) |

(Continued)

(52) U.S. Cl.
CPC .............. *H05K 7/06* (2013.01); *B64D 45/00* (2013.01); *C23C 4/01* (2016.01); *C23C 4/08* (2013.01); *C23C 4/134* (2016.01); *H05K 1/0284* (2013.01); *H05K 3/14* (2013.01); *H05K 3/388* (2013.01); *H05K 3/4673* (2013.01); *H05K 2201/09018* (2013.01); *H05K 2201/0999* (2013.01); *H05K 2203/0528* (2013.01); *H05K 2203/095* (2013.01); *H05K 2203/1344* (2013.01)

(58) Field of Classification Search
None
See application file for complete search history.

(56) References Cited

U.S. PATENT DOCUMENTS

| 4,031,268 A | * | 6/1977 | Fairbairn | ................. H05K 3/14 118/301 |
| 5,391,841 A | * | 2/1995 | Quick | ................. H01L 21/4807 174/258 |
| 5,808,270 A | | 9/1998 | Marantz et al. | |

(Continued)

FOREIGN PATENT DOCUMENTS

| DE | 69729805 T2 | 11/2004 |
| DE | 102012212283 A1 | 1/2014 |

(Continued)

OTHER PUBLICATIONS

Extended European Search Report, dated Oct. 21, 2015, regarding Application No. EP15168176.4, 8 pages.

(Continued)

*Primary Examiner* — Courtney Smith
*Assistant Examiner* — Jessey R Ervin
(74) *Attorney, Agent, or Firm* — Yee & Associates, P.C.

(57) ABSTRACT

A method for manufacturing a composite part. Layers of composite material are cured to form the composite part. A primer is depicted on a surface of the composite part. A group of conductive elements is deposited on the primer to form an electronic device on the primer.

11 Claims, 20 Drawing Sheets

(51) Int. Cl.
    *H05K 3/38* (2006.01)
    *H05K 3/46* (2006.01)

(56) References Cited

U.S. PATENT DOCUMENTS

| | | | |
|---|---|---|---|
| 5,969,260 | A | 10/1999 | Belk et al. |
| 8,029,295 | B2 | 10/2011 | Strauss |
| 8,704,102 | B2 | 4/2014 | Duce et al. |
| 8,986,816 | B2* | 3/2015 | Zielinski ............... B32B 5/02 244/1 A |
| 2008/0028956 | A1 | 2/2008 | Sedberry et al. |
| 2008/0142238 | A1* | 6/2008 | Rawlings ............... B64D 45/02 174/2 |
| 2010/0018959 | A1* | 1/2010 | Wilson ............... H05B 3/34 219/202 |
| 2011/0222225 | A1* | 9/2011 | Kessler ............... G06F 3/05 361/679.02 |
| 2012/0197482 | A1* | 8/2012 | Moser ............... G01M 5/0033 701/32.2 |
| 2012/0273260 | A1 | 11/2012 | Olden et al. |
| 2013/0079955 | A1 | 3/2013 | Masiello et al. |
| 2013/0199825 | A1* | 8/2013 | Bruderer ............... H05K 3/4673 174/251 |

FOREIGN PATENT DOCUMENTS

| | | |
|---|---|---|
| JP | 2006137143 A | 6/2006 |
| JP | 2007157384 A | 6/2007 |
| JP | 2009511751 A | 3/2009 |
| JP | 2010540345 A | 12/2010 |
| JP | 20140058311 A | 4/2014 |
| WO | 2012055934 A1 | 5/2012 |

OTHER PUBLICATIONS

Wright et al., "Electrical Connector Assembly for Data Traces on a Structural Surface," U.S. Appl. No. 13/960,184, filed Aug. 6, 2013, 24 pages.
Canadian Intellectual Property Office Office Action, dated Mar. 9, 2017, regarding Application No. 2,882,475, 4 pages.
Canadian Intellectual Property Office Office Action, dated Apr. 7, 2017, regarding Application No. 2,882,475, 4 pages.
Japanese Notice of Reasons for Rejection and English Translation, dated May 15, 2018, regarding Application No. 2015-095550, 15 pages.

* cited by examiner

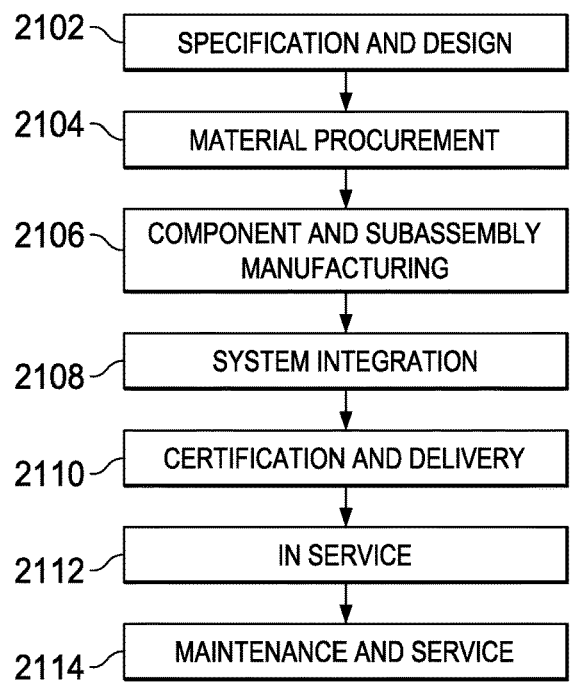
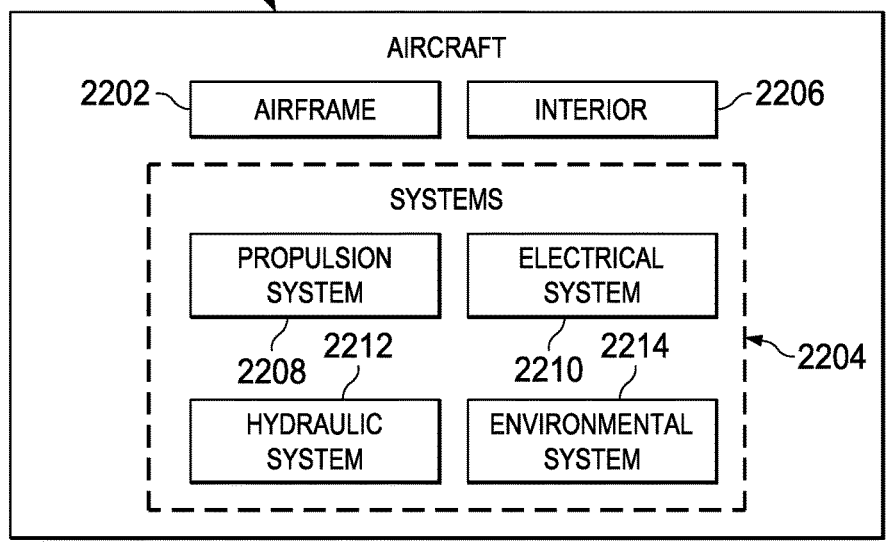

INTEGRATED WIRING SYSTEM FOR COMPOSITE STRUCTURES

BACKGROUND INFORMATION

1. Field

The present disclosure relates generally to aircraft and, in particular, to electrical wiring in aircraft. Still more particularly, the present disclosure relates to a method and apparatus for depositing conductive materials on composite structures used for aircraft.

2. Background

Manufacturing aircraft is a complex process. Thousands of components may be manufactured and assembled to form an aircraft. These components include structural components, aircraft systems, control devices, passenger seating, storage compartments, and other suitable components. Some of these components include one or more composite materials.

To supply electricity to various aircraft systems, electrical wiring is installed throughout the aircraft. This electrical wiring may be run along the entire fuselage of the aircraft and supply different types of devices within the aircraft. For instance, electrical wiring may supply a control surface, a display device, a light, an appliance, and other types of devices. Electrical wiring also may be run through each wing to supply devices on the wing with power.

During installation, electrical wires are often mounted to aircraft structures in bundles. These bundles comprise a plurality of individual wires which transmit electrical power.

A number of additional components are needed to secure these wire bundles to the aircraft. For example, without limitation, connectors, disconnect panels, ties, fasteners, clamps, standoffs, spanner bars, brackets, spacers, and other components may be needed to hold the wire bundles in place. Each of these components may be manufactured separately and then installed in the aircraft by an operator.

To properly install the wire bundles, an operator may drill holes in an aircraft structure before inserting components used to hold the wire bundles. For example, an operator may drill holes in a composite skin panel to insert a fastener and a bracket to hold a wire bundle. These holes may be drilled at certain intervals for the brackets such that sagging of the wiring is reduced. An operator also may have to assemble the wire bundles using ties to hold the individual electrical wires together.

Performing these manufacturing and installation operations, as well others, may take more time than desired. As a result, the cost of manufacturing an aircraft may be increased. Additionally, manufacturing the wiring bundles, as well as the components used to secure these bundles to the aircraft, may add more weight and complexity to the aircraft than desired. Therefore, it would be desirable to have a method and apparatus that take into account at least some of the issues discussed above, as well as other possible issues.

SUMMARY

In one illustrative embodiment, a method for manufacturing a composite part is presented. Layers of composite material are cured to form the composite part. A primer is deposited on the composite part. A group of conductive elements is deposited on the primer to form an electronic device.

In another illustrative embodiment, an apparatus comprises a composite part for an aircraft, a primer deposited on a surface of the composite part, and an electronic device. The electronic device comprises a group of conductive elements deposited on the primer. Power is supplied to a device connected to the composite part through current flowing through the group of conductive elements.

In yet another illustrative embodiment, another method for manufacturing a composite part is presented. Layers of composite material are laid up for the composite part. The layers of composite material are cured to form the composite part. A group of conductive elements is deposited on a layer of material using a direct-write process such that an electronic device is formed on the layer of material. The layer of material having the group of conductive elements is co-bonded with the composite part. Power is supplied to a device connected to the composite part through current flowing through the group of conductive elements.

The features and functions can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the illustrative embodiments are set forth in the appended claims. The illustrative embodiments, however, as well as a preferred mode of use, further objectives and features thereof, will best be understood by reference to the following detailed description of an illustrative embodiment of the present disclosure when read in conjunction with the accompanying drawings, wherein:

FIG. 21 is an illustration of an aircraft manufacturing and service method in the form of a block diagram in accordance with an illustrative embodiment; and FIG. 22 is an illustration of an aircraft in the form of a block diagram in which an illustrative embodiment may be implemented.

DETAILED DESCRIPTION

The illustrative embodiments recognize and take into account one or more different considerations. For example, the illustrative embodiments recognize and take into account that it may be desirable to reduce the time needed to install electrical wiring in an aircraft. For example, the illustrative embodiments recognize and take into account that countless labor hours are spent installing wire bundles throughout the aircraft. The illustrative embodiments recognize and take into account that an automated wiring process may reduce the time spent installing these wire bundles.

The illustrative embodiments also recognize and take into account that it may be desirable to reduce the weight of an aircraft to increase its aerodynamic performance, fuel efficiency, and other performance parameters. For instance, the illustrative embodiments recognize and take into account that securing wiring bundles in an aircraft requires use of various accessory structures such as clamps, ties, and brackets. These accessory structures may add undesired weight to the aircraft.

The illustrative embodiments further recognize and take into account that it may be desirable to ensure structural integrity of composite aircraft structures that are modified during installation of wire bundles in the aircraft. As an example, inspection is performed to ensure that composite structures that were drilled, milled, or otherwise altered during installation of the wire bundles still have a desired level of structural integrity. This inspection may lead to reworking or discarding of composite aircraft structures, which increases the time needed to manufacture the aircraft.

Thus, the illustrative embodiments provide a method and apparatus for manufacturing a composite part with conductive elements. The composite part may be configured for use in an aircraft. In an illustrative embodiment, layers of composite material are cured to form the composite part. A primer is deposited on the surface of the composite part after curing. A group of conductive elements is deposited on the primer such that an electronic device is formed on the primer on the surface of the composite part.

Figure 1:
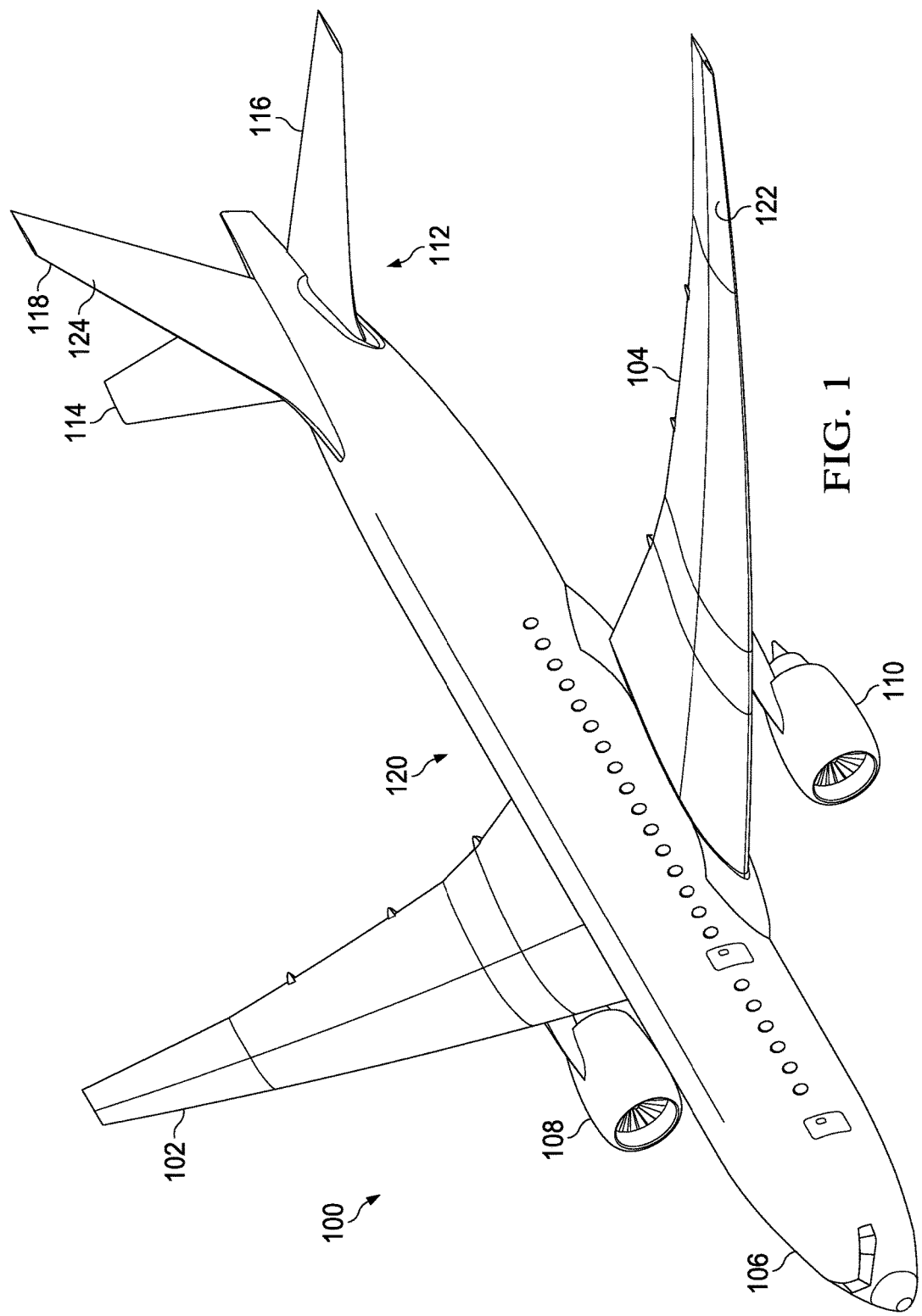
FIG. 1 is an illustration of an aircraft in accordance with an illustrative embodiment.

Referring now to the figures and, in particular, with reference to FIG. 1, an illustration of an aircraft is depicted in accordance with an illustrative embodiment. In this depicted example, a perspective view of aircraft 100 is shown.

As depicted, aircraft 100 has wing 102 and wing 104 attached to body 106. Aircraft 100 includes engine 108 attached to wing 102 and engine 110 attached to wing 104.

In this illustrative example, body 106 has tail section 112. Horizontal stabilizer 114, horizontal stabilizer 116, and vertical stabilizer 118 are attached to tail section 112 of body 106.

Aircraft 100 has composite skin 120 in this illustrative example. Composite skin 120 is formed from layers of composite material. These layers of composite material have been laid up and cured upon exposure to temperature and pressure to form panels for composite skin 120. In addition to composite skin 120, other types of composite structures may be arranged within the interior of aircraft 100. Skin panel 122 on wing 104 and skin panel 124 on vertical stabilizer 118 are examples of panels that form composite skin 120.

An illustrative embodiment may be implemented in aircraft 100 to provide electrical power to various devices used for aircraft 100. Specifically, a wiring system may be deposited on portions of composite skin 120 to provide electrical power to these devices. A wiring system also may be deposited on other composite structures within aircraft 100.

Figure 2:
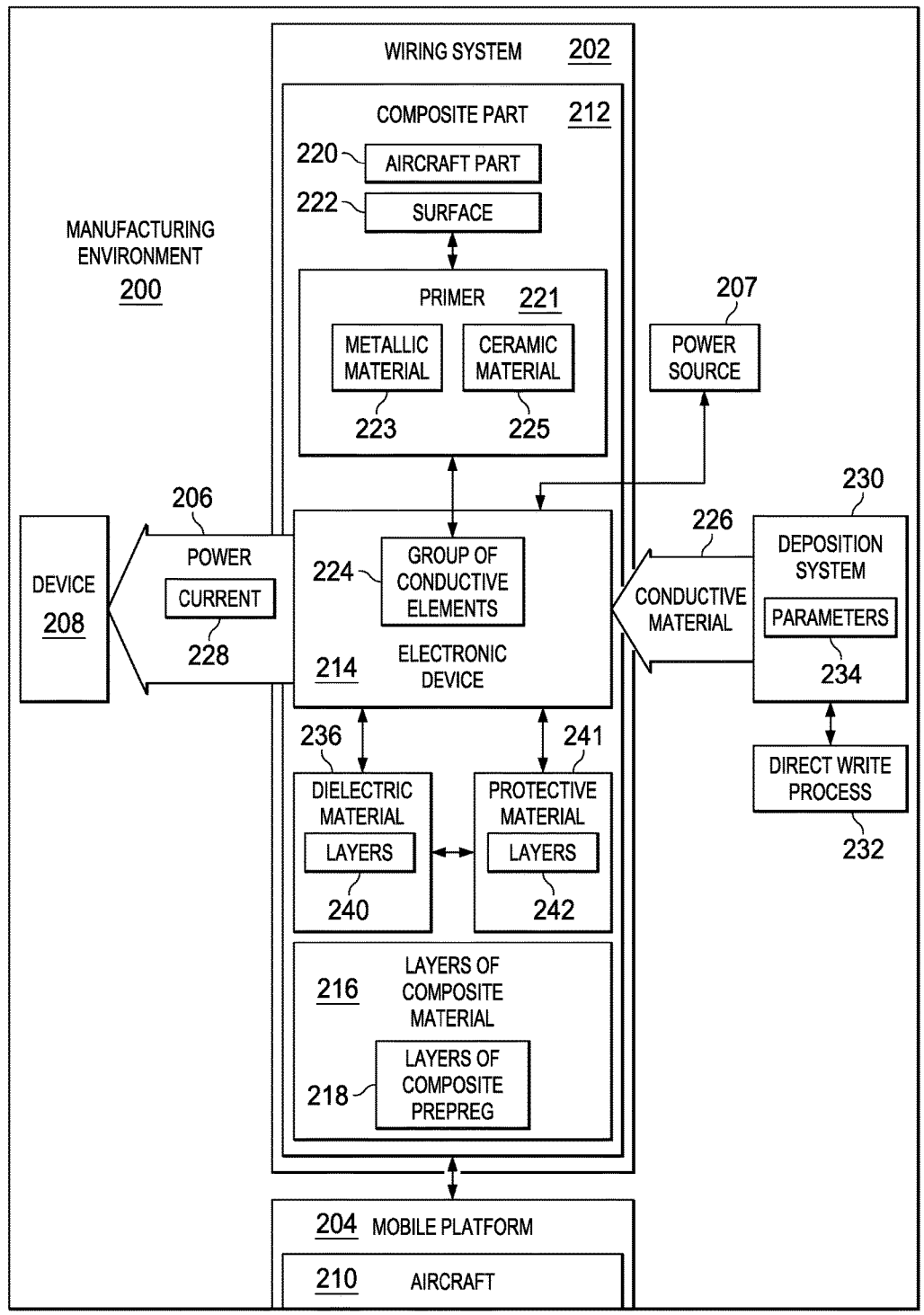
FIG. 2 is an illustration of a manufacturing environment in the form of a block diagram in accordance with an illustrative embodiment.

Turning next to FIG. 2, an illustration of a manufacturing environment is depicted in the form of a block diagram in accordance with an illustrative embodiment. In this depicted example, manufacturing environment 200 is an environment in which wiring system 202 is formed for mobile platform 204. Wiring system 202 in mobile platform 204 may be used to supply power 206 to device 208.

In this illustrative example, mobile platform 204 takes the form of aircraft 210. Aircraft 100 in FIG. 1 is an example of a physical implementation for aircraft 210 shown in block form in this figure.

As depicted, wiring system 202 includes a number of different components. As used herein, a "number of" items may be one or more items. In this illustrative example, a number of components is one or more components. Wiring system 202 includes composite part 212 and electronic device 214 in this illustrative example.

As illustrated, composite part 212 is a structure formed from layers of composite material 216. Each of the layers of composite material 216 may include reinforcing fibers bound in polymer resin matrix. In this illustrative example, the layers of composite material 216 include a reinforcing material (e.g., fibers in sheets). These sheets may be in the form of tapes, fabrics or take other suitable forms. In this depicted example, the fibers and resins are arranged and cured to form composite part 212.

Layers of composite material 216 may be formed of layers of composite prepreg 218, in which the reinforcing material (e.g., fibers) has been infused or preimpregnated with resin. Layers of composite prepreg 218 may be laid up on a tool and cured to form composite part 212. In other illustrative examples, the resin may be infused into the reinforcing material after layers of composite material 216 have been laid up to form the shape for composite part 212.

In this depicted example, composite part 212 is a cured composite part. In other words, layers of composite material 216 have already been hardened. No additional curing process is needed for composite part 212 to be used in a platform such as aircraft 100 in FIG. 1.

In this illustrative example, composite part 212 is shaped to take the form of aircraft part 220. Aircraft part 220 is a structure configured for use in aircraft 210. In some examples, composite part 212 may be shaped to take the form of an aircraft part 220 such as a skin panel, an interior panel, a stringer, a frame, a spar, a wing, a winglet, a fuselage, an empennage, a control surface, and other aircraft parts to which or across which it may be desirable for wiring to be routed. In some examples, composite part 212 is shaped to take the form of an aircraft part as described above before the electronic device 214 is provided on composite part 212. In some examples, composite part 212 may have a complex shape, which may include one or more contoured surfaces.

As illustrated, composite part 212 has surface 222. Surface 222 may be an exterior surface of composite part 212. For instance, surface 222 may be located on the most superficial layer of composite material used to form composite part 212. Surface 222 may be a contoured surface in some examples.

In this illustrative example, electronic device 214 is deposited on surface 222 of composite part 212, which may provide the composite part 212 with additional functionality. For example, with electronic device 214, composite part 212 may have functionality in addition to the composite part 212 functioning as a secondary or primary structure of mobile platform 204.

In this particular example, electronic device 214 is a device configured to send electrical signals to device 208. Specifically, electronic device 214 supplies power 206 to device 208. For example, electronic device 214 may be operable to supply power 206 to device 208 from power source 207.

In this illustrative example, power source 207 may be a device located on composite part 212. As an example, power source 207 may be a solar cell located on a skin panel. In another example, power source 207 may be located remote to composite part 212. In this case, power source 207 may be electrically connected to composite part 212 in some manner. For example, power source 207 may be a battery system located remote to electronic device 214 and electrically connected to electronic device 214 via electronic traces at one or more points along composite part 212. Power source 207 also may take other forms, depending on the particular implementation.

As depicted, electronic device 214 comprises group of conductive elements 224. As used herein, a "group of" items is more than one item. In this illustrative example, group of conductive elements 224 includes more than one conductive element.

In this depicted example, a conductive element in group of conductive elements 224 is a structure configured to conduct electrical signals. Group of conductive elements 224 comprise at least one of an electrical trace, an interconnect, a wire, a transistor, an integrated circuit, a conductive connector, or other suitable types of conductive elements.

As used herein, the phrase "at least one of," when used with a list of items, means different combinations of one or more of the listed items may be used and only one of the items in the list may be needed. The item may be a particular object, thing, or category. In other words, "at least one of" means any combination of items or number of items may be used from the list, but not all of the items in the list may be required.

For example, "at least one of item A, item B, and item C" may mean item A; item A and item B; item B; item A, item B, and item C; or item B and item C. In some cases, "at least one of item A, item B, and item C" may mean, for example, without limitation, two of item A, one of item B, and ten of item C; four of item B and seven of item C; or some other combination.

As illustrated, group of conductive elements 224 comprises conductive material 226. Conductive material 226 is a type of material that allows a flow of electrical signals in one or more directions. Conductive material 226 may include a metal, a metal alloy, or some other type of conductor. Specifically, conductive material 226 may be selected from at least one of copper, copper alloy, carbon, graphene, titanium, nickel, silver, or other suitable conductors.

In this illustrative example, power 206 is supplied to device 208 connected to composite part 212 through current 228 flowing through group of conductive elements 224. In one illustrative example, conductive traces are deposited on primer 221 extending from one end of composite part 212 to another end of composite part 212 to form a power rail for supplying power 206 across composite part 212.

In this depicted example, device 208 is an object configured to use power 206 to perform operations in aircraft 210. Device 208 may be, for example, without limitation, a light, an appliance, a control system, a sensor, a display device, a computer, a field replaceable unit (FRU), an inflight entertainment system (IFE), a graphical indicator, a beacon, an emergency device, a door system, or some other suitable mechanism.

As an example, when device 208 is a light on a wing, electronic device 214 may be deposited on surface 222 of the wing to supply power 206 to the light. As another example, when device 208 includes interior lighting in the passenger cabin of aircraft 210, electronic device 214 may be deposited on surface 222 of an interior panel of the passenger cabin to supply power 206 to the interior lighting. In still another illustrative example, when device 208 is a sensor, electronic device 214 may be located on surface 222 of a skin panel to supply power 206 to the sensor to detect icing conditions for aircraft 210.

In this illustrative example, electronic device 214 may be deposited onto composite part 212 using deposition system 230. In particular, group of conductive elements 224 in electronic device 214 are deposited onto primer 221 applied to surface 222 of composite part 212 using deposition system 230.

In this illustrative example, an item is "deposited" onto a substrate, such as surface 222 of composite part 212 with primer 221, when it is added to the substrate. In this manner, deposition of group of conductive elements 224 is the "addition" or "application" of conductive elements to the surface of composite part 212. In some cases, resistive elements or other structures may be deposited on surface 222 in addition to group of conductive elements 224.

As depicted, deposition system 230 includes various components configured to apply group of conductive elements 224 to composite part 212. For instance, deposition system 230 may include at least one of a robotic device, a sprayer, a brush, a gantry, a nozzle, a coating tool, a gun, a plasma spraying system, and other suitable types of tools. Deposition system 230 also may include a power source, a control device, a heating system, and other accessory components.

In this depicted example, deposition system 230 deposits group of conductive elements 224 using direct-write process 232. In this illustrative example, direct-write process 232 may comprise the additive process of depositing only required material directly to a substrate.

For instance, direct-write process 232 comprises depositing only conductive material 226 on composite part 212. Direct-write process 232 may differ from standard electronics processing techniques, which may require that the substrate be completely covered with the desired material and that excess material be removed. This removal may be referred to as "etching" in some illustrative examples.

In this illustrative example, direct-write process 232 may be selected from one of a thermal plasma spray, a nanoparticle ink-jet process, screen-printing, an atomized jetted ink process, kinetic metallization, and other suitable types of direct-write processes. With direct-write process 232, no etching is needed to remove excess material from surface 222 of composite part 212. For example, when using a thermal plasma spray, conductive material 226 is directly sprayed in a desired configuration on top of primer 221 and no etching is performed.

In this depicted example, primer 221 is deposited onto surface 222 to prepare surface 222 to receive conductive material 226. For instance, primer 221 may be deposited on surface 222 prior to the application of conductive material 226 to promote adhesion of conductive material 226. In an illustrative example, primer 221 promotes adhesion by substantially reducing the spread of conductive material 226 to undesired areas on surface 222. In other words, primer 221 prevents excess conductive material 226 from running.

Primer 221 also may provide other functionalities. For instance, primer 221 may provide corrosion resistance, enhanced durability for conductive material 226, and increased structural load handling capabilities, among others. In further examples, primer 221 may provide an insulating layer between conductive material 226 and the composite part 212.

In this illustrative example, primer 221 is applied directly to surface 222 in a manner that results in a uniform surface for depositing conductive material 226. In an illustrative example, a "uniform" surface refers to a surface that has substantially the same characteristics across its entirety. This uniform surface may be the portion of surface 222 to which conductive material 226 is being applied. In some examples, this uniform surface may be a substantially smooth surface for application of conductive material 226. In another example, this uniform surface may be a sanded surface. With a uniform surface, conductive material 226 may be deposited on primer 221 evenly.

Primer 221 is applied to surface 222 of composite part 212 using direct write process 232. As an example, primer 221 may be sprayed directly onto surface 222 of composite part 212 using thermal plasma spray.

In an illustrative example, primer 221 is deposited on surface 222 of composite part 212 in one or more layers. Each layer of primer 221 may comprise one or more materials. These materials may be selected from at least one of metallic material 223, ceramic material 225, or some other suitable type of material.

In this depicted example, when applying primer 221, a layer of metallic material 223 is sprayed on surface 222 of composite part 212. A layer of ceramic material 225 is then sprayed on top of the layer of metallic material 223. Additional layers of material may be deposited before or after the layer of metallic material 223 and the layer of ceramic material 225. In is illustrative example, conductive material 226 is then deposited on layer of ceramic material 225 of primer 221.

Deposition system 230 may use a pre-planned electronic architecture to deposit conductive material 226 on primer 221 to form electronic device 214 for composite part 212. For example, parameters 234 may be used to deposit conductive material 226 such that electronic device 214 functions as desired.

As an example, an operator may input parameters 234 to control deposition of conductive material 226. Examples of parameters 234 include signal paths, orientations for the conductive elements, connection sites, dimensions, spacing, and other suitable parameters. Deposition system 230 may then use parameters 234 to deposit conductive material 226 in a desired manner.

In some illustrative examples, additional layers of material may be added to surface 222 of composite part 212 prior to, during, or after deposition of primer 221 and conductive material 226. For example, primer 221 may comprise additional dielectric material 236. Further, protective material 241 may be added to composite part 212. These materials may be sprayed onto composite part. 212, bonded to composite part 212, or attached to composite part 212 in some other manner.

In this illustrative example, dielectric material 236 may be added to surface 222 prior to formation of group of conductive elements 224. Specifically, dielectric material 236 may be part of primer 221 sprayed onto surface 222. For instance, a number of layers 240 of dielectric material 236 may be sprayed on surface 222 under the layer of metallic material 223. In other examples, a number of layers of dielectric material 236 may be added after layer of metallic material 223. One or more layers of dielectric material 236 may be added in addition to the layer of ceramic material 225. In some cases, dielectric material 236 may be added during or after depositing conductive material 226. Dielectric material 236 may be applied using direct-write process 232.

Dielectric material 236 may be a type of polymer configured to provide electrical insulation for group of conductive elements 224 in this illustrative example. For example, dielectric material 236 insulates each of group of conductive elements 224 from one another. In another illustrative example, dielectric material 236 insulates group of conductive elements 224 from surface 222 of composite part 212. In still other illustrative examples, dielectric material 236 insulates group of conductive elements 224 from metal fasteners and other structures attached to composite part 212.

Dielectric material 236 may include a material selected from one of fiberglass, direct-write deposited ceramic or polymer, a high solids polymeric primer or paint, polymeric films such as polyimide, polyethylene terephthalate (PET), polyether ether ketone (PEEK), polyvinyl fluoride, and other suitable types of dielectric material.

In this depicted example, protective material 241 is a type of material configured to shield group of conductive elements 224 from the environment around composite part 212. For example, protective material 241 may protect group of conductive elements 224 from corrosion, weather conditions, electromagnetic effects, other environmental conditions, or a combination thereof.

In this illustrative example, protective material 241 provides electrical isolation from the environment. Protective material 241 also extends the life of group of conductive elements 224. Protective material 241 also increases the safety of composite part 212 with conductive elements 224.

As depicted, a number of layers 242 of protective material 241 may be placed on top of group of conductive elements 224 after direct-write process 232 is completed. Protective material 241 may include a material selected from one of a polymer, a polytetrafluoroethylene (Teflon) tape, ceramic, paint, a primer, and other suitable types of materials and combinations of materials. The thickness of layers 242 of protective material 241 may depend on the properties of the material.

Wiring system 202 provides power 206 to device 208 in aircraft 210 without the need to install wiring in aircraft 210. Instead, electronic device 214 with group of conductive elements 224 may be deposited directly onto surface 222 of a cured composite part using direct-write process 232.

Figure 3:
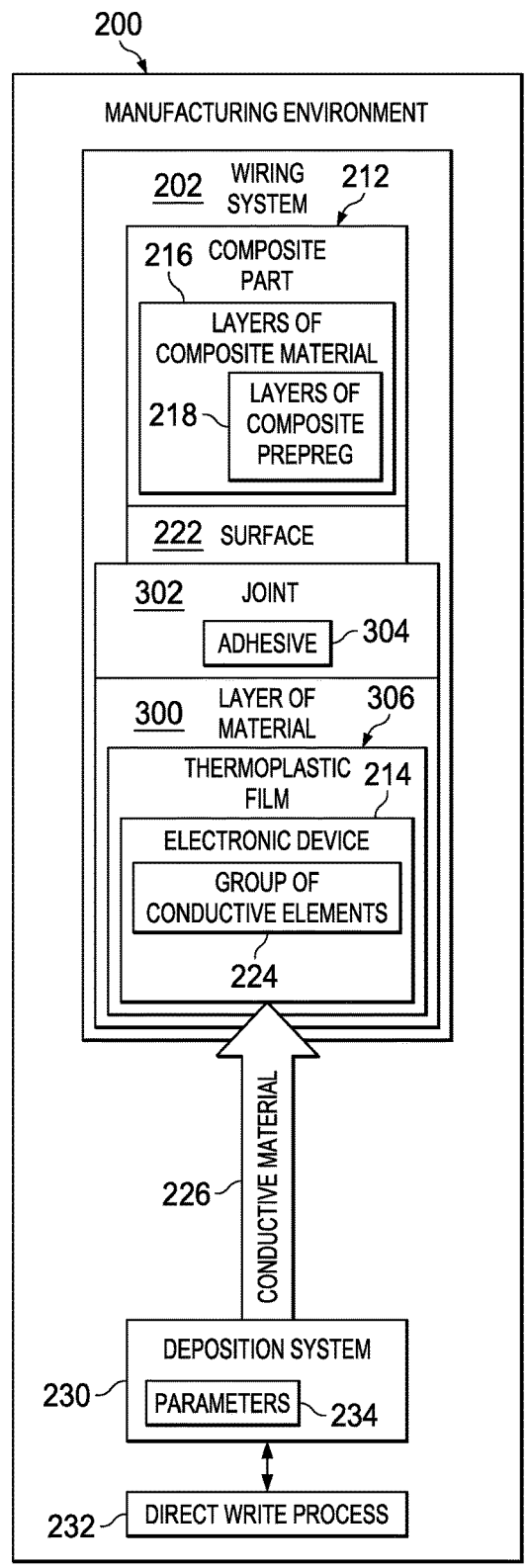
FIG. 3 is an illustration of a block diagram of a wiring system in accordance with an illustrative embodiment.

With reference now to FIG. 3, an illustration of a block diagram of a wiring system is depicted in accordance with an illustrative embodiment. In this illustrative example, an alternative embodiment of wiring system 202 in manufacturing environment 200 is shown.

As depicted, layer of material 300 is co-bonded with surface 222 of composite part 212. Specifically, layer of material 300 and surface 222 of composite part 212 are co-bonded to form joint 302. Layer of material 300 is co-bonded with surface 222 of composite part 212 after composite part 212 has been trimmed, formed into a desired shape, and its surface prepared for co-bonding.

In this illustrative example, "co-bonding" is the process of joining two components together in which one of the components is uncured and the other component is pre-cured. In other words, unlike co-curing, where two components are cured at substantially the same time, co-bonding involves simultaneously curing one part and bonding it to another fully cured part. In this depicted example, composite part 212 is fully cured before joint 302 is formed between layer of material 300 and composite part 212.

Layer of material 300 comprises thermoplastic film 306 in this illustrative example. Thermoplastic film 306 is a polymer selected from one of polyvinyl fluoride, polyamide, polyether ether ketone (PEEK), polyetherketoneketone (PEKK), and other suitable types of materials.

In some cases, adhesive 304 may be used to join layer of material 300 and composite part 212. Adhesive 304 may be an epoxy or some other material configured to bond layer of material 300 with surface 222 of composite part 212.

In this depicted example, electronic device 214 is deposited on layer of material 300. Instead of depositing conductive material 226 directly on surface 222 of composite part 212, deposition system 230 deposits conductive material 226 on layer of material 300 to form group of conductive elements 224. Layer of material 300 is then co-bonded with composite part 212 such that electronic device 214 can supply power 206 to device 208 as shown in block form in FIG. 2.

The illustration of wiring system 202 and the components within wiring system 202 in FIG. 2 and FIG. 3 are not meant to imply physical or architectural limitations to the manner in which an illustrative embodiment may be implemented. Other components in addition to or in place of the ones illustrated may be used. Some components may be optional. Also, the blocks are presented to illustrate some functional components. One or more of these blocks may be combined, divided, or combined and divided into different blocks when implemented in an illustrative embodiment.

Mobile platform 204 in FIG. 2 may take other forms other than aircraft 210. For example, mobile platform 204 may be a surface ship, a tank, a personnel carrier, a train, a spacecraft, a space station, a satellite, a submarine, an automobile, and other types of mobile platforms.

In some cases, direct-write process 232 may be implemented to form layers of conductive elements on top of surface 222 of composite part 212. For example, primer 221 may be applied to surface 222 and a first electronic device may be formed on primer 221. Additional primer 221 may be applied to the first electronic device sufficient to insulate the first electronic device. A second electronic device may be formed on top of this primer. Additional primer may be added on top of the second electronic device, and so forth, to form layers of electronic devices for composite part 212.

As another example, additional layers of material may be added between surface 222 of composite part 212 and layer of material 300 shown in FIG. 3. Protective layers may be added after electronic device 214 is deposited onto layer of material 300. These protective layers may be added prior to co-bonding with composite part 212 or after co-bonding has been completed.

In yet another illustrative example, one or more additional electronic devices may be embedded within layers of composite material 216. One or more additional electronic devices also may be embedded in layer of material 300.

In still another illustrative example, an electronic device may be deposited on surface 222 of composite part 212 and another electronic device may be deposited on layer of material 300. In this case, these devices may send electrical signals to one another, supply power 206 to different devices, or perform in some other manner.

As another illustrative example, electronic device 214 may comprise a bus. When electronic device 214 comprises a bus, electronic device 214 sends a plurality of signals back and forth between devices. The bus may be a power bus, a data bus, or perform some other function.

In yet another illustrative example, layer of material 300 and composite part 212 may be joined after both components have been previously cured. For example, deposition system 230 first uses direct-write process 232 to form group of conductive elements 224 on layer of material 300. Layer of material 300 is then cured. Finally, layer of material 300 with group of conductive elements 224 is bonded to composite part 212. The two components may be bonded using an adhesive, such as adhesive 304.

FIGS. 4-7 illustrate a process for depositing a group of conductive elements onto a surface of a skin panel. An enlarged view of skin panel 122 for wing 104 of aircraft 100 from FIG. 1 is shown in FIGS. 4-7. In FIG. 8, skin panel 122 is shown installed in aircraft 100. Skin panel 122 is an example of a physical implementation for composite part 212 shown in block form in FIG. 2.

In FIGS. 4-7, conductive elements are deposited on the surface of skin panel 122 that faces the exterior of aircraft 100 in FIG. 1. However, the process shown in FIGS. 4-8 is applicable to all surfaces of skin panel 122, including surfaces that face the interior of aircraft 100. For example, conductive elements 602 shown in FIGS. 6-7 may run through the interior of wing 104 on skin panel 122.

Figure 4:
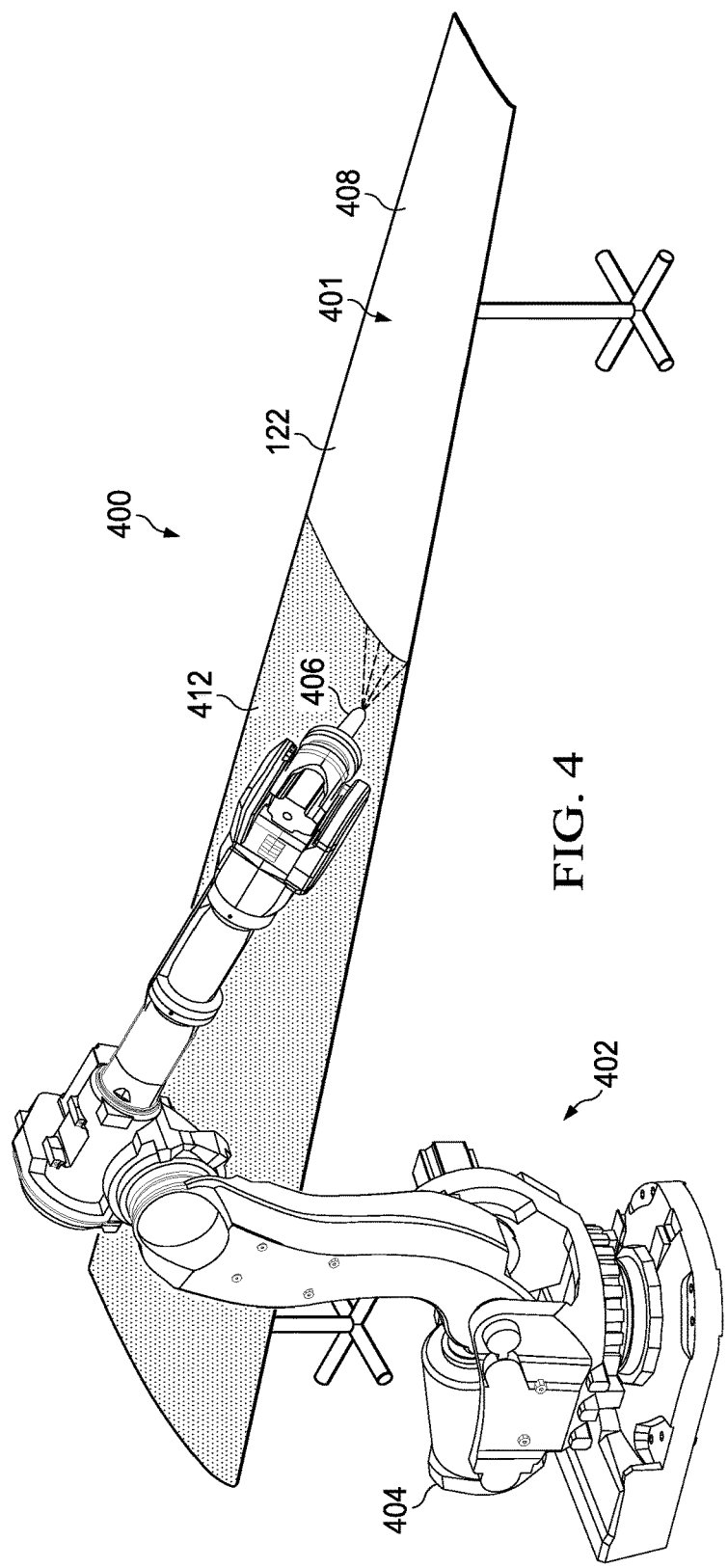
FIG. 4 is an illustration of a skin panel for a wing in accordance with an illustrative embodiment.

Turning to FIG. 4, an illustration of a skin panel for a wing is depicted in accordance with an illustrative embodiment. In this depicted example, skin panel 122 is shown in manufacturing environment 400 prior to being installed in wing 104. Manufacturing environment 400 is an example of a physical implementation for manufacturing environment 200 shown in block form in FIG. 2. A number of processes may be performed on skin panel 122 prior to installation in wing 104.

In this illustrative example, skin panel 122 comprises composite material 401. Composite material 401 may include layers of composite prepreg that have been cured. In this manner, skin panel 122 is a cured part that has already been trimmed to have a desired shape.

As depicted, deposition system 402 is positioned relative to skin panel 122. Deposition system 402 includes robotic arm 404 and end effector 406.

End effector 406 is configured to deposit primer 412 on surface 408 of skin panel 122. In this illustrative example, primer 412 includes a layer of metallic material and a layer of ceramic material on the layer of metallic material.

Additional layers of dielectric material (not shown in this view) also may be added under or on top of these two layers. Primer 412 provides insulation, durability, and other characteristics in this illustrative example.

Figure 5:
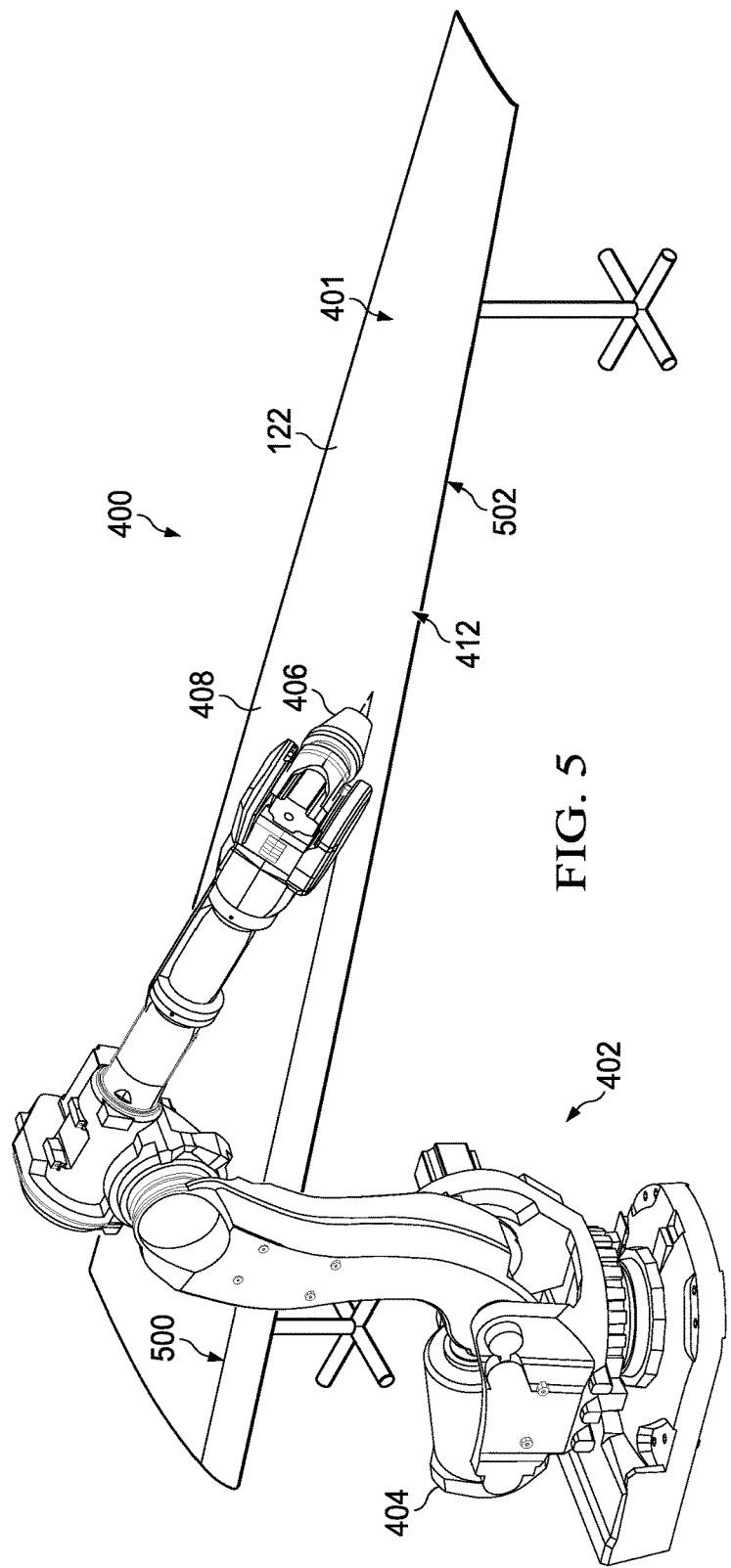
FIG. 5 is an illustration of a direct-write tool depositing conductive material in accordance with an illustrative embodiment.

In FIG. 5, an illustration of a direct-write tool depositing conductive material is depicted in accordance with an illustrative embodiment. End effector 406 takes the form of a direct-write tool in this illustrative example.

As shown, end effector 406 is configured to deposit conductive material 500 on primer 412. Primer 412 is transparent in this view such that the deposition of conductive material 500 may be seen more clearly. Conductive material 500 may be desired on leading edge 502 of skin panel 122 such that power may be supplied to a light at the distal end of wing 104.

Figure 6:
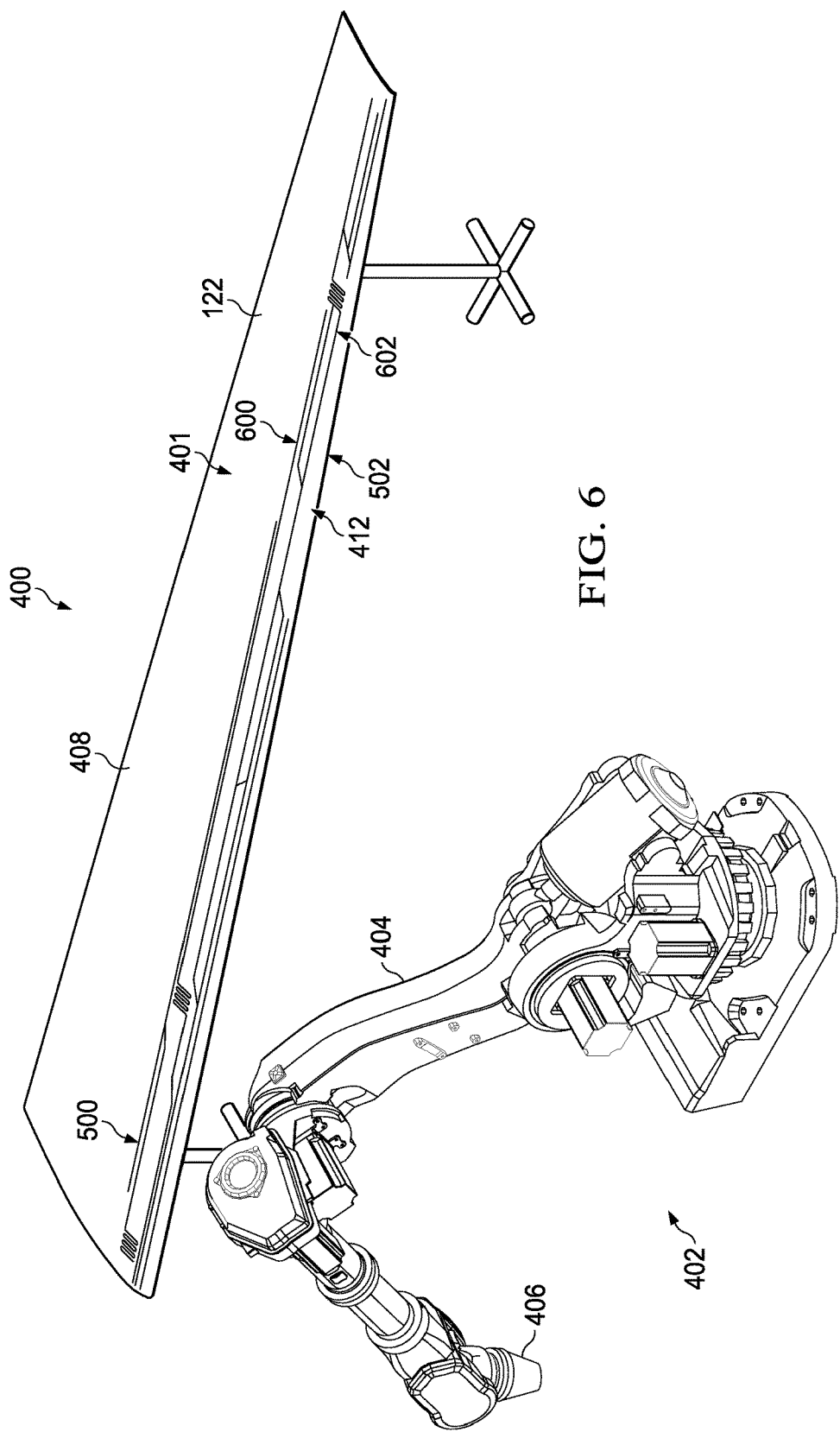
FIG. 6 is an illustration of a skin panel with an electronic device in accordance with an illustrative embodiment.

Turning to FIG. 6, an illustration of a skin panel with an electronic device is depicted in accordance with an illustrative embodiment. In this depicted example, electronic device 600 has been formed on surface 408 of skin panel 122 from FIG. 5.

As illustrated, electronic device 600 comprises conductive elements 602. Deposition system 402 has deposited conductive material 500 on primer 412 to form conductive elements 602.

As depicted, deposition system 402 uses a direct-write technique to deposit conductive material 500 directly onto primer 412 of skin panel 122 without the need for etching afterward. Skin panel 122 with electronic device 600 may be part of a wiring system for aircraft 100 in FIG. 1.

Figure 7:
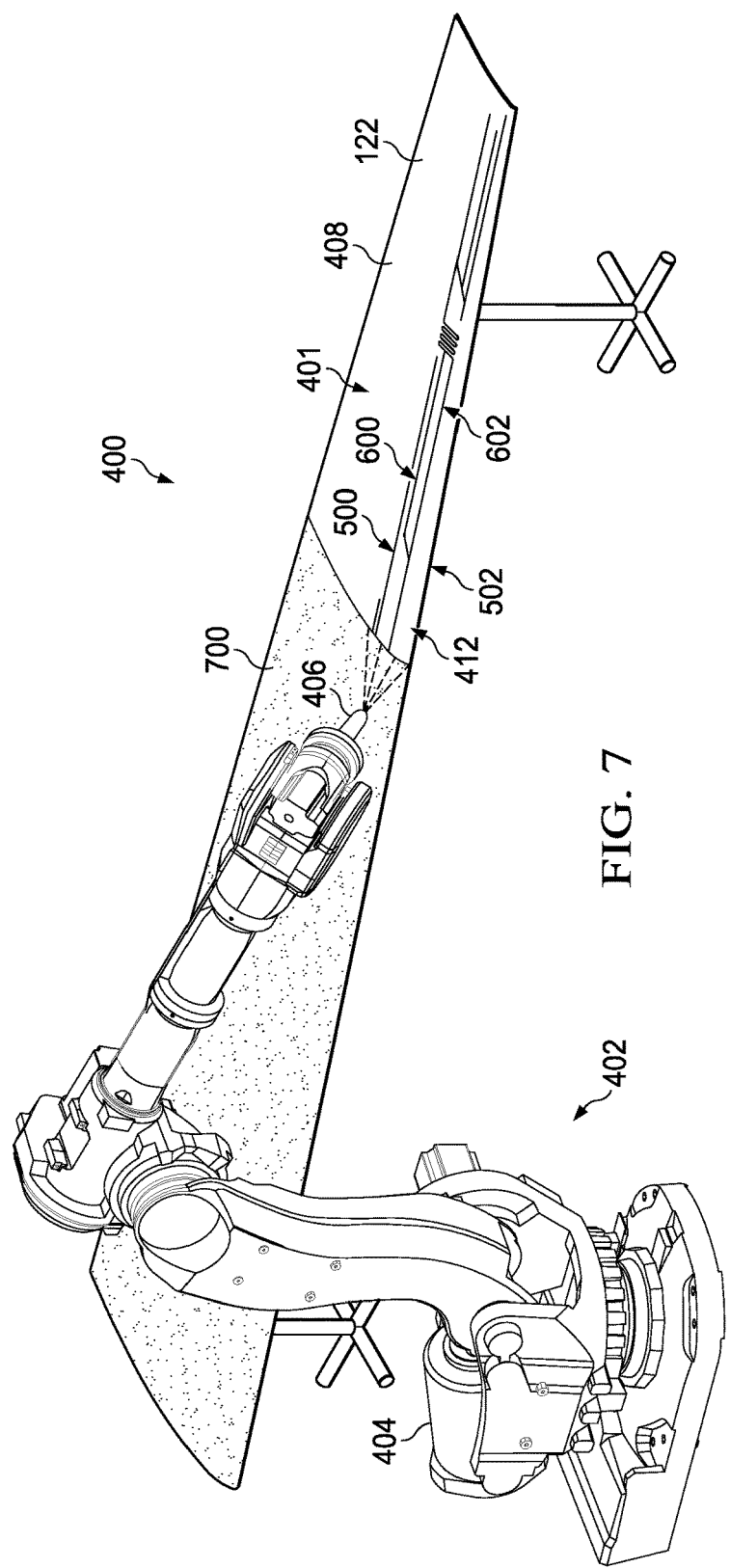
FIG. 7 is an illustration of a skin panel of a wing with an electronic device in accordance with an illustrative embodiment.
Figure 8:
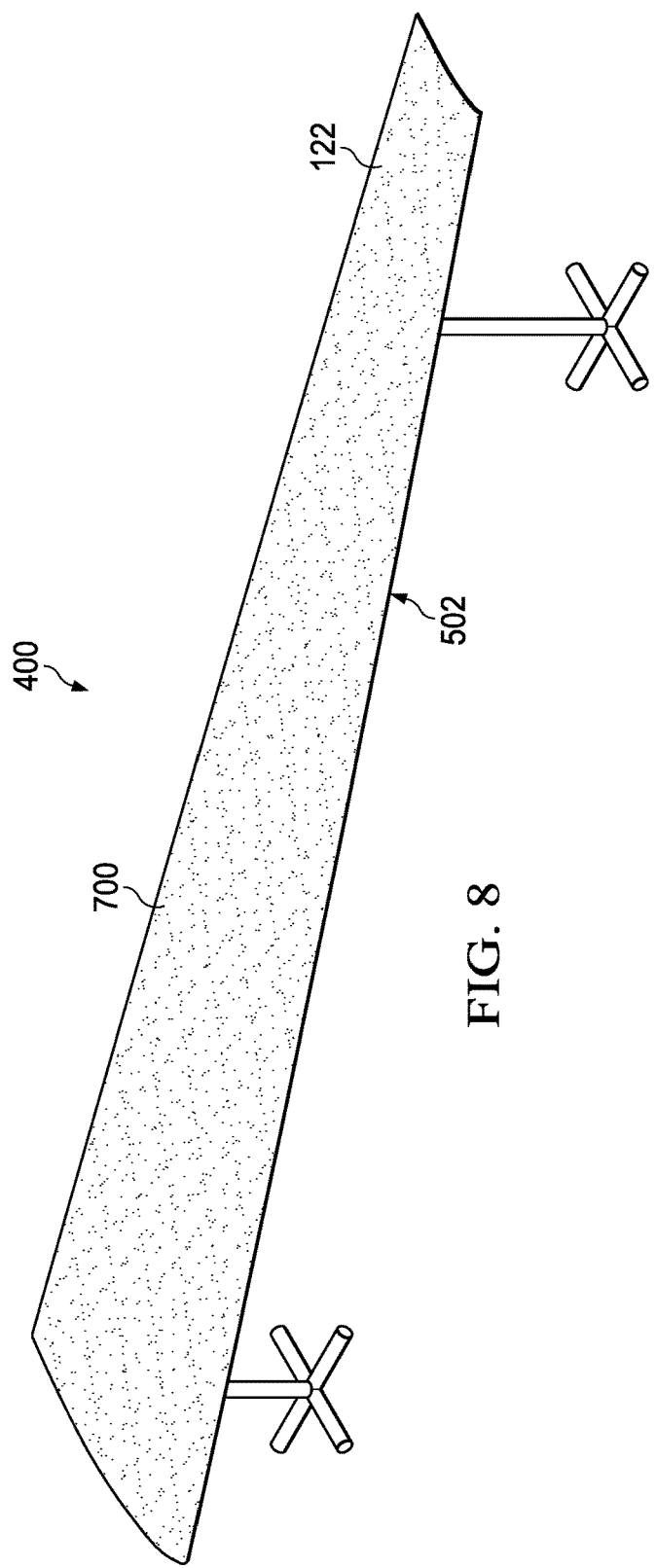
FIG. 8 is an illustration of a finished skin panel with a wiring system in accordance with an illustrative embodiment.

Next, in FIG. 7, an illustration of a skin panel of a wing with an electronic device is depicted in accordance with an illustrative embodiment. In this example, end effector 406 shown in FIG. 6 has been configured to spray protective material 700 on top of group of conductive elements 602 in electronic device 600. Protective material 700 shields group of conductive elements 602 from the environment surrounding skin panel 122.

In other illustrative examples, protective material 700 may be applied in some other manner. For instance, a layer of protective material 700 may be bonded to skin panel 122 on top of conductive elements 602.

FIG. 8 shows an illustration of a finished skin panel with a wiring system in accordance with an illustrative embodiment. In this depicted example, skin panel 122 is ready to be installed in wing 104 shown in FIG. 1.

Figure 9:
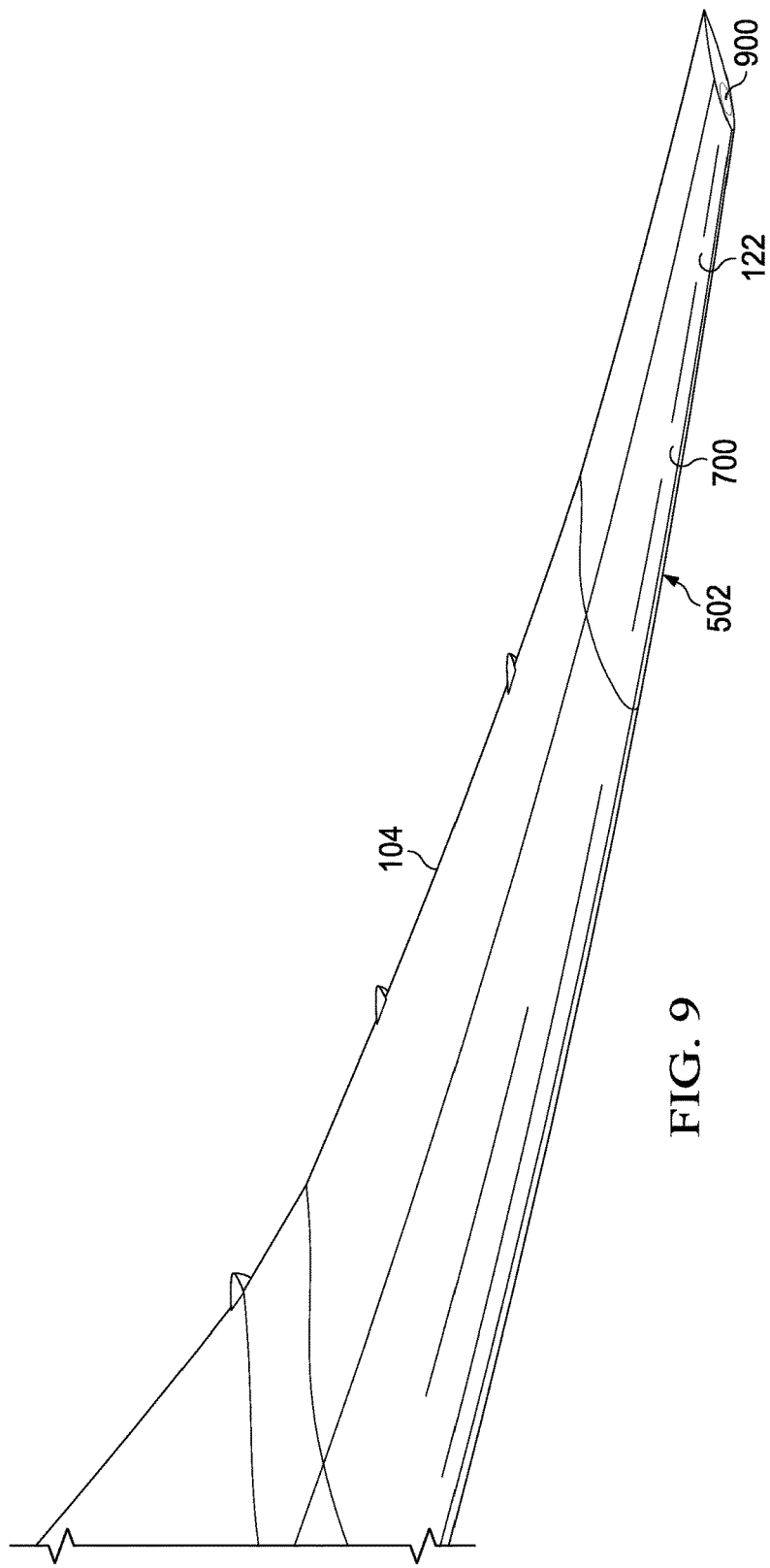
FIG. 9 is an illustration of a wing for an aircraft in accordance with an illustrative embodiment.

In FIG. 9, an illustration of a wing for an aircraft is depicted in accordance with an illustrative embodiment. An enlarged view of wing 104 for aircraft 100 from FIG. 1 is shown in this figure.

Skin panel 122 has been installed in wing 104. Light 900 is connected to skin panel 122 on wing 104 in this illustrative example. As depicted in this example, electronic device 600 (not shown in this view) supplies power to light 900 using conductive elements 602.

Although FIGS. 4-9 show the deposition of electronic device 600 on a skin panel for a wing, electronic device 600 may be deposited in a similar manner for other structures in aircraft 100. These structures include a wing tip, a stringer, an interior panel, or other aircraft composite structures.

Electronic device 600 also may be used in conjunction with wired systems. For example, a portion of aircraft 100 may be wired using physical wire bundles and a portion of aircraft 100 may include electronic devices deposited in the manner described in FIGS. 4-9.

Connections for electronic device 600 may be made without substantial rework or modification of skin panel 122. For instance, a portion of protective material 700 may be removed to expose one or more of conductive elements 602. Conductive elements 602 may then be connected to a power source or other structure, without drilling holes in the composite part.

Figure 10:
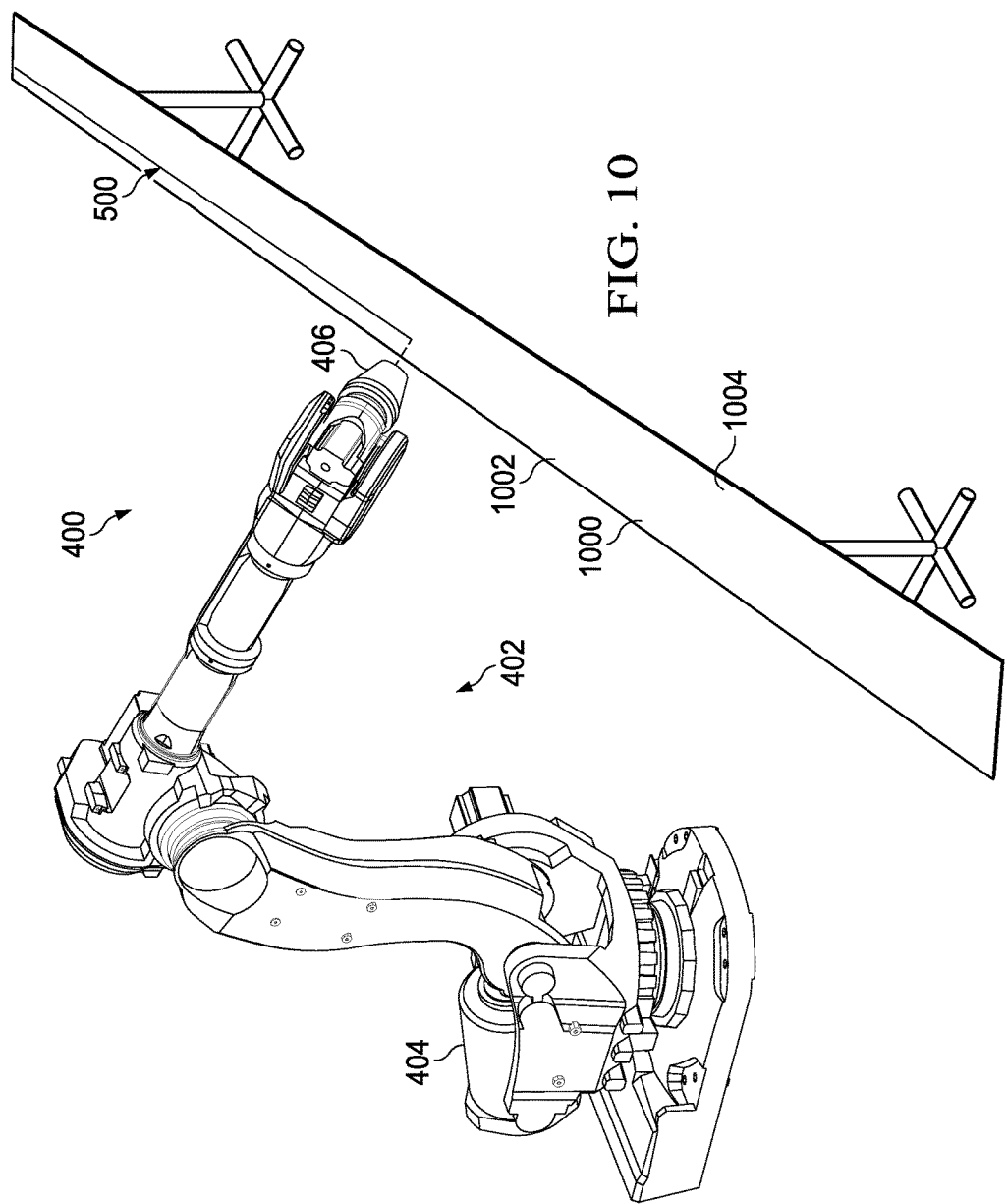
FIG. 10 is an illustration of a layer of material for co-bonding with a skin panel in accordance with an illustrative embodiment.
Figure 11:
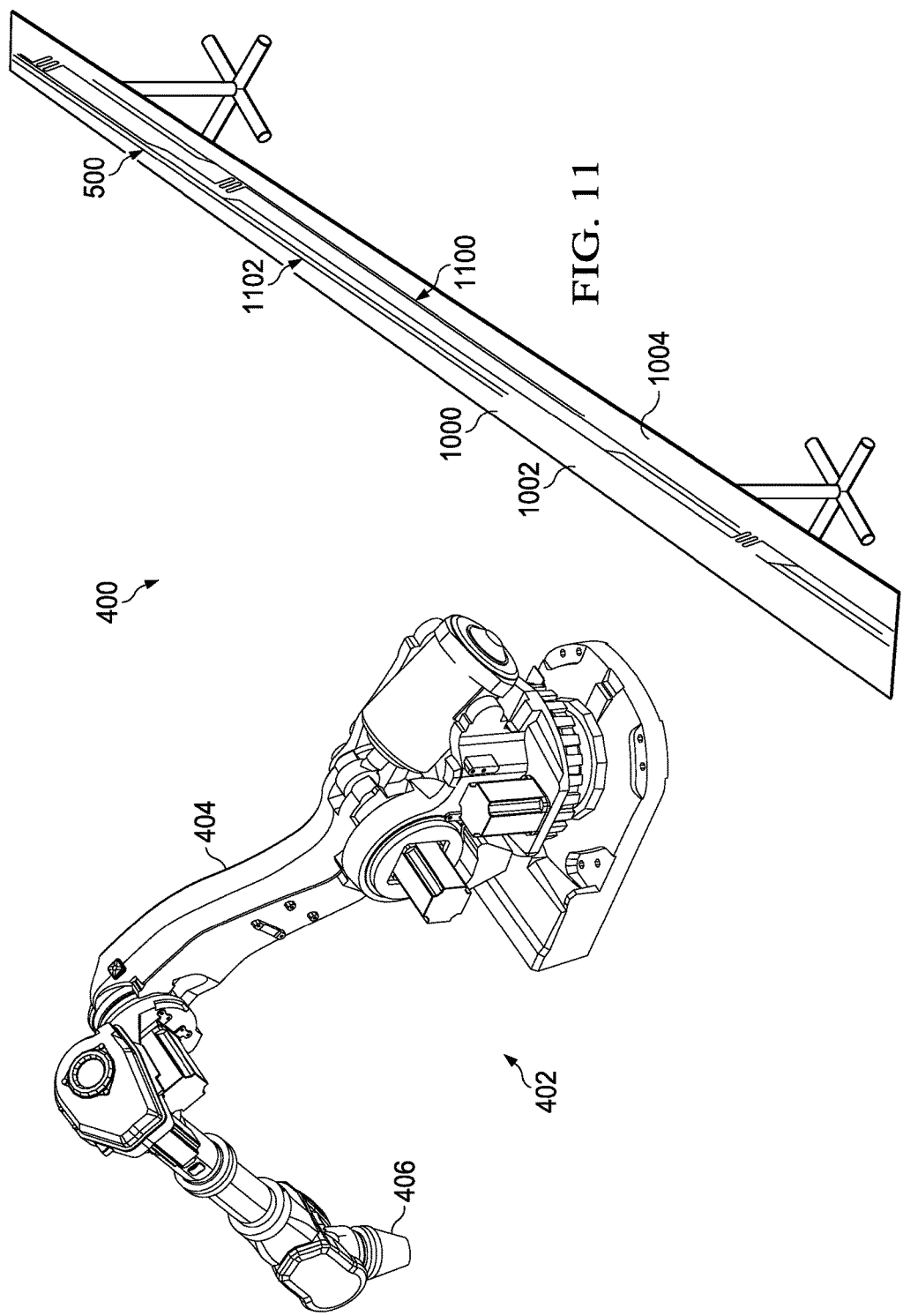
FIG. 11 is an illustration of a layer of material with an electronic device in accordance with an illustrative embodiment.
Figure 12:
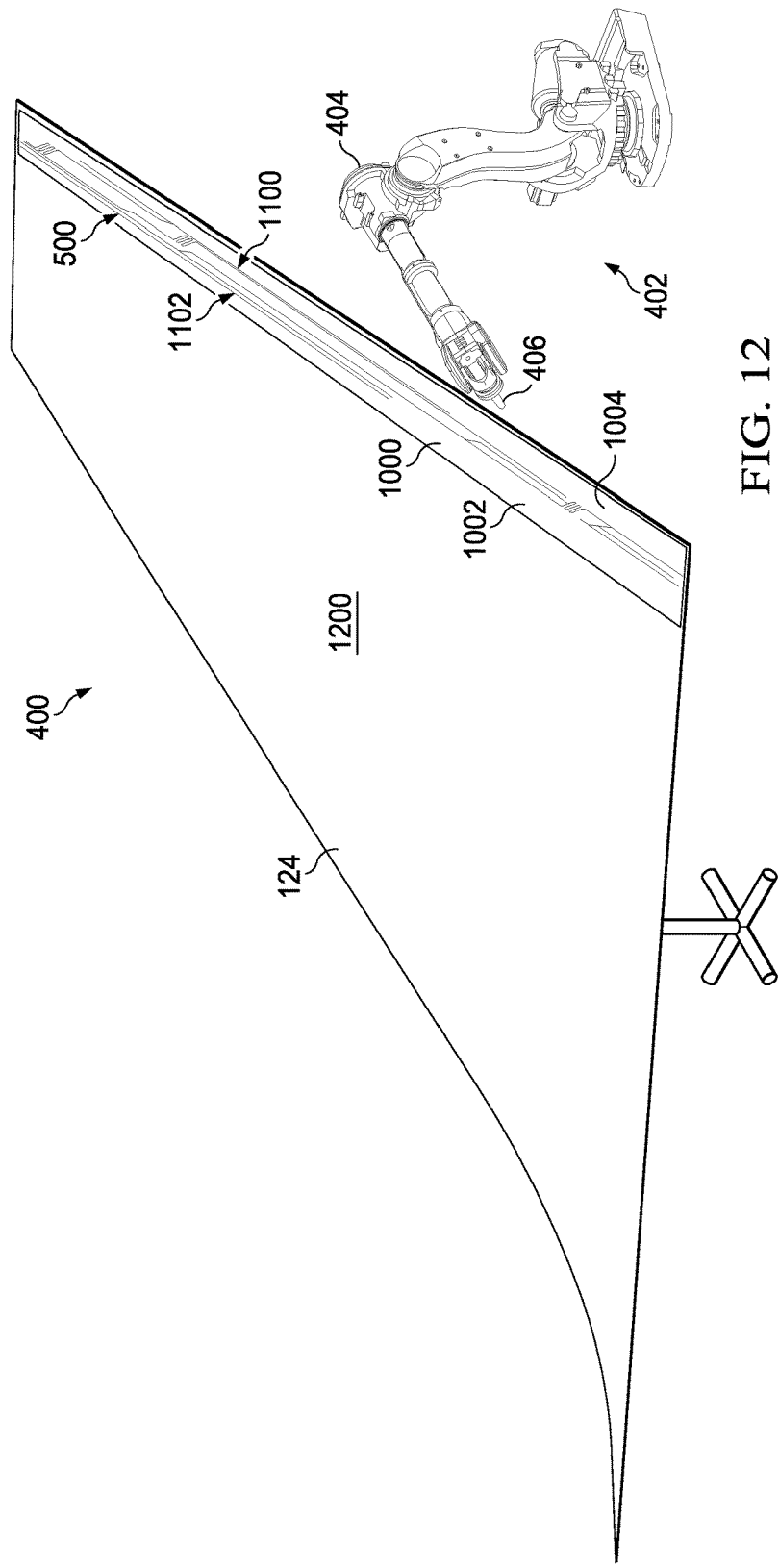
FIG. 12 is an illustration of a layer of material co-bonded with a skin panel in accordance with an illustrative embodiment.
Figure 13:
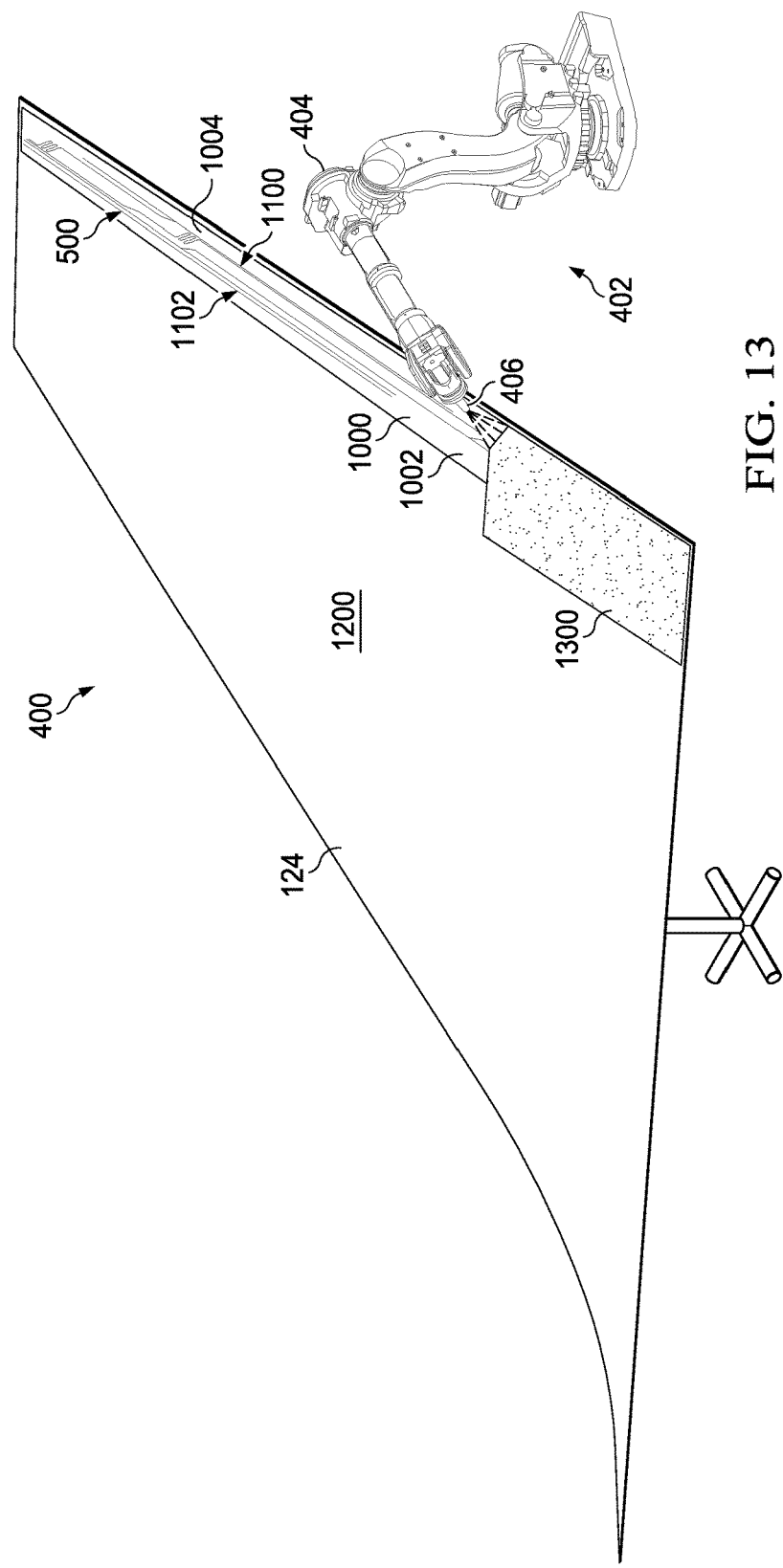
FIG. 13 is an illustration of a skin panel with a layer of material having an electronic device in accordance with an illustrative embodiment.
Figure 14:
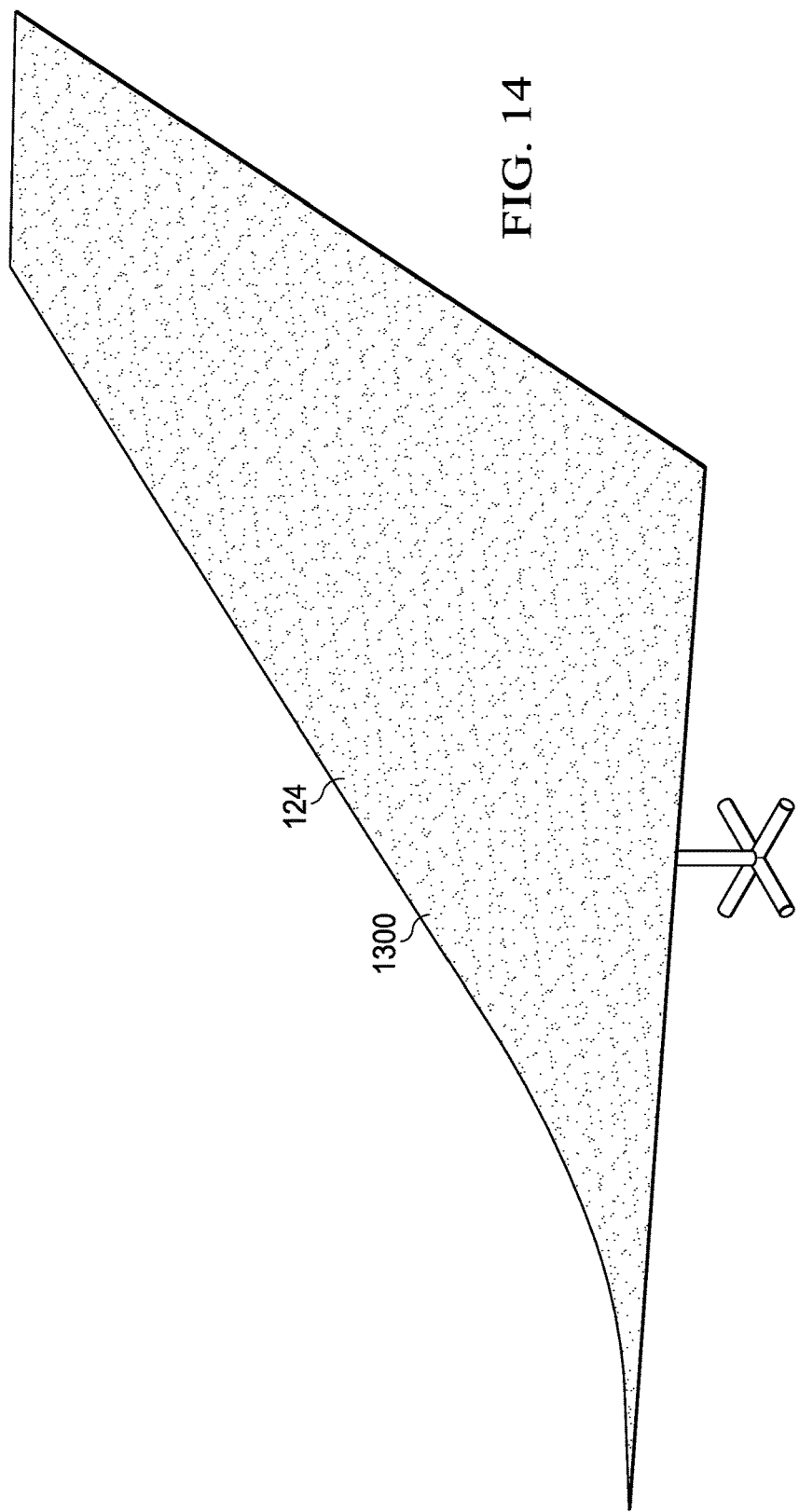
FIG. 14 is an illustration of a finished skin panel for a vertical stabilizer in accordance with an illustrative embodiment.
Figure 15:
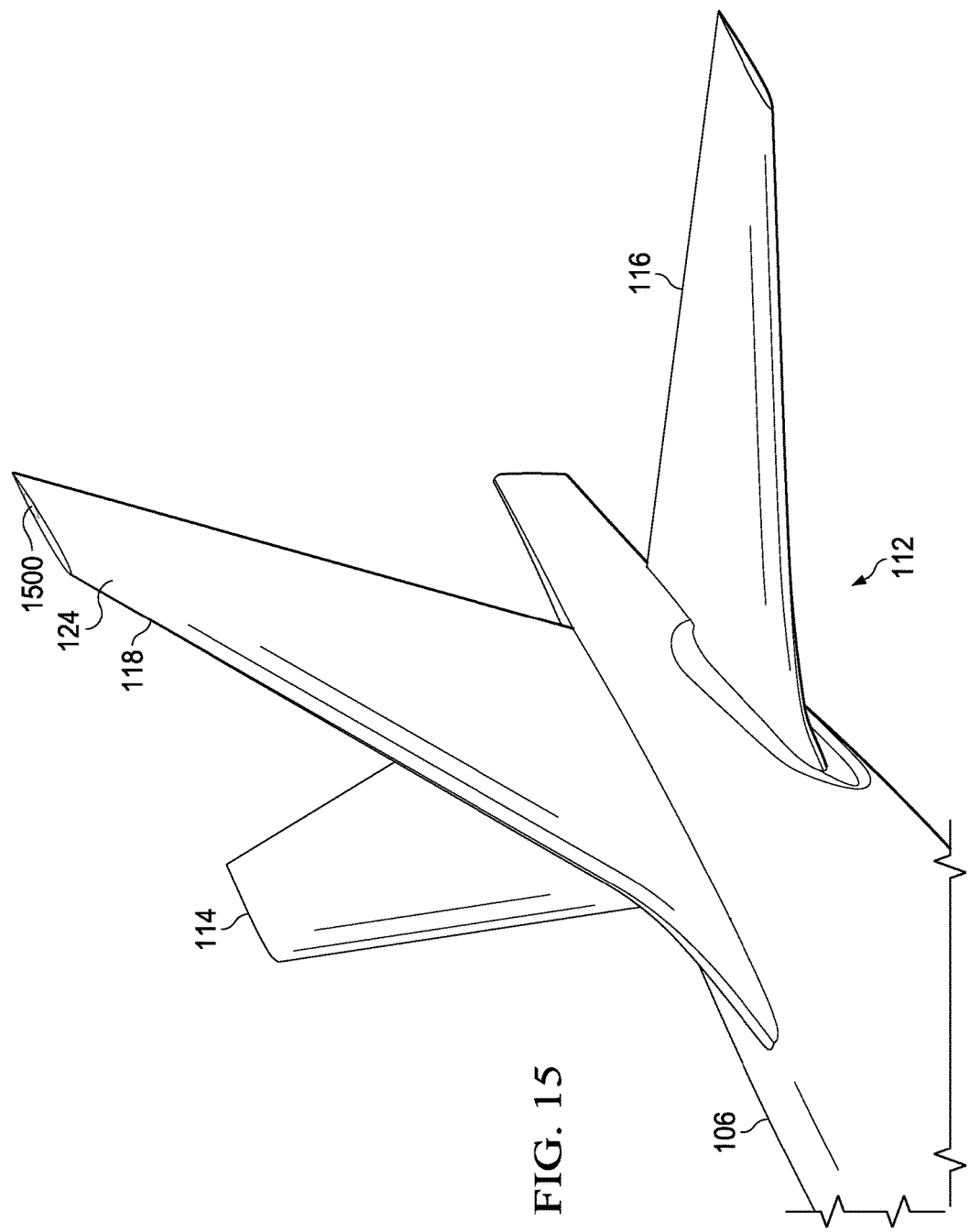
FIG. 15 is an illustration of a vertical stabilizer for an aircraft in accordance with an illustrative embodiment.

FIGS. 10-14 illustrate a process for co-bonding a layer of material with a skin panel. The layer of material comprises conductive elements. An enlarged view of the layer of material is shown in FIGS. 10-14. An enlarged view of skin panel 124 for vertical stabilizer 118 of aircraft 100 from FIG. 1 is shown in FIGS. 12-14. In FIG. 15, skin panel 124 is shown installed in aircraft 100.

Layer of material 1000 is an example of a physical implementation of layer of material 300 shown in block form in FIG. 3. Skin panel 124 is an example of a physical implementation for composite part 212 shown in block form in FIG. 3.

Turning to FIG. 10, an illustration of a layer of material for co-bonding with a skin panel is depicted in accordance with an illustrative embodiment. In this depicted example, layer of material 1000 is shown in manufacturing environment 400 prior to being co-bonded with skin panel 124 for vertical stabilizer 118 in FIG. 1.

A number of processes may be performed on layer of material 1000 prior to co-bonding with skin panel 124. In this illustrative example, layer of material 1000 comprises thermoplastic film 1002. Thermoplastic film 1002 takes the form of polyvinyl fluoride in this illustrative example.

In this depicted example, deposition system 402 is positioned relative to layer of material 1000. End effector 406 deposits conductive material 500 onto surface 1004 of layer of material 1000.

It may be desirable to co-bond layer of material 1000 having conductive material 500 to skin panel 124 such that power may be supplied to a light at the distal end of vertical stabilizer 118. A number of layers of dielectric material may have been placed on layer of material 1000 to provide insulation in this illustrative example.

In FIG. 11, an illustration of a layer of material with an electronic device is depicted in accordance with an illustrative embodiment. In this depicted example, electronic device 1100 has been formed on surface 1004 of layer of material 1000.

As illustrated, electronic device 1100 comprises conductive elements 1102. Deposition system 402 has deposited conductive material 500 on surface 1004 of layer of material 1000 to form conductive elements 1102.

Deposition system 402 uses a direct-write process in this illustrative example. In this manner, conductive material 500 is deposited without the need of post-deposition etching. Electronic device 1100 with conductive elements 1102 may be part of a wiring system for aircraft 100 in FIG. 1.

Next, in FIG. 12, an illustration of a layer of material co-bonded with a skin panel is depicted in accordance with an illustrative embodiment. In this depicted example, skin panel 124 has been previously cured and layer of material 1000 is uncured.

As shown, layer of material 1000 is co-bonded to skin panel 124. An operator may use various co-bonding techniques to join the two structures together. In this manner, electronic device 1100 is immovably attached to surface 1200 of skin panel 124.

Turning now to FIG. 13, an illustration of a skin panel with a layer of material having an electronic device is depicted in accordance with an illustrative embodiment. In this example, end effector 406 sprays protective material 1300 on top of group of conductive elements 1102 in electronic device 1100. Protective material 1300 shields group of conductive elements 1102 from the environment surrounding skin panel 124.

FIG. 14 shows an illustration of a finished skin panel for a vertical stabilizer in accordance with an illustrative embodiment. In this depicted example, skin panel 124 is ready to be installed in vertical stabilizer 118 shown in FIG. 1.

In FIG. 15, an illustration of a vertical stabilizer for an aircraft is depicted in accordance with an illustrative embodiment. In this depicted example, an enlarged view of vertical stabilizer 118 for aircraft 100 from FIG. 1 is shown.

Skin panel 124 has been installed in vertical stabilizer 118. Light 1500 is connected to skin panel 124 on vertical stabilizer 118 in this illustrative example. Electronic device 1100 (not shown in this view) supplies power to light 1500 using conductive elements 1102.

Figure 16:
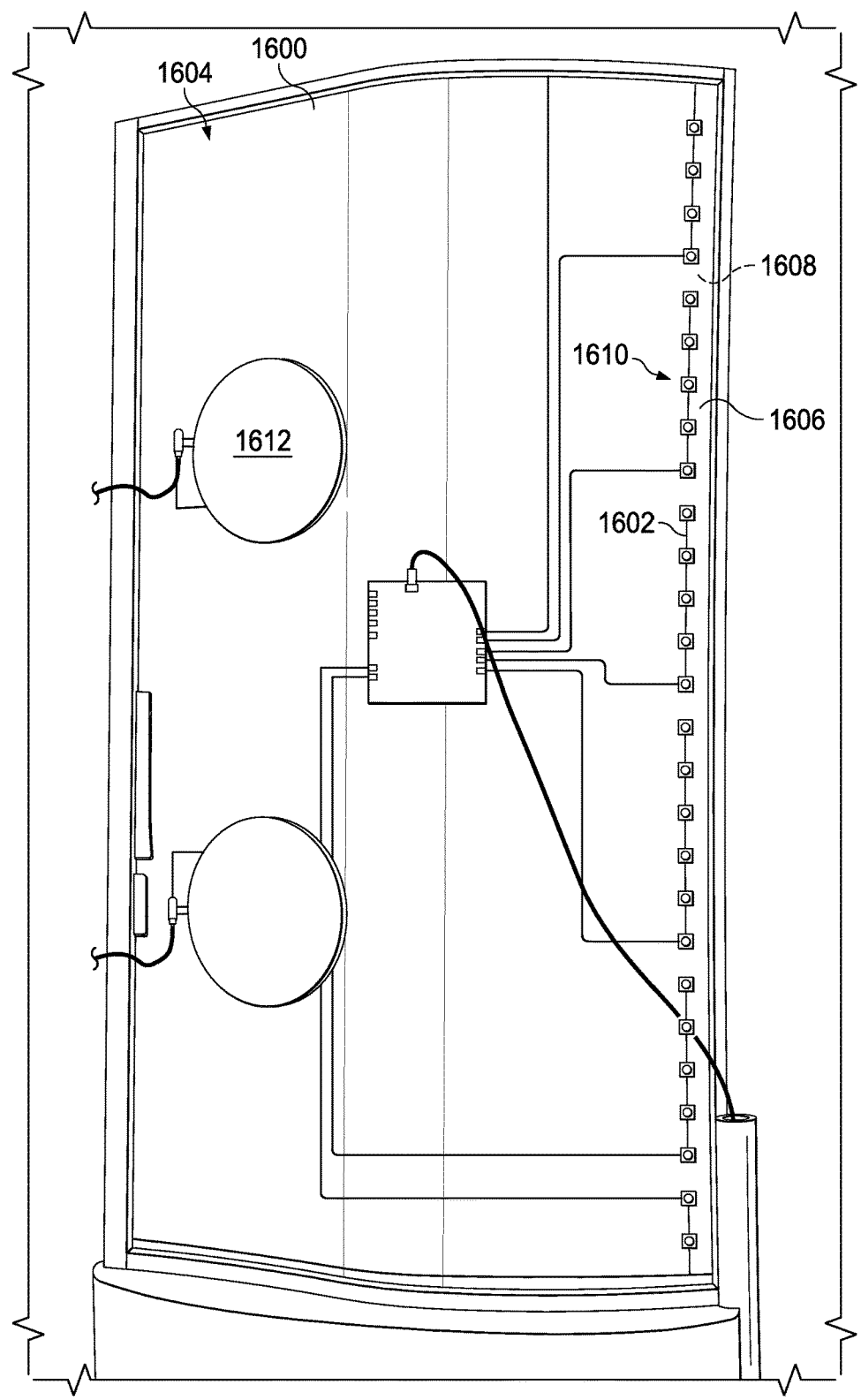
FIG. 16 is an illustration of an interior panel with an electronic device in accordance with an illustrative embodiment.

Referring next to FIG. 16, an illustration of an interior panel with an electronic device is depicted in accordance with an illustrative embodiment. In this depicted example, interior panel 1600 is shown after conductive elements 1602 have been deposited.

Interior panel 1600 comprises composite material 1604. Interior panel 1600 is another example of a physical implementation for composite part 212 shown in block form in FIG. 2.

Interior panel 1600 is an example of a composite panel used in the interior of aircraft 100 in FIG. 1. In particular, interior panel 1600 may form part of the ceiling of a passenger cabin in aircraft 100.

In this depicted example, interior panel 1600 has side 1606 and side 1608. Side 1608 is opposite side 1606. When installed in aircraft 100, side 1608 faces the interior of the passenger cabin.

As depicted, plurality of light sources 1610 and audio system 1612 are also arranged on interior panel 1600. Plurality of light sources 1610 may be light-emitting diodes (LEDs) or other illumination devices. Audio system 1612 may include a plurality of speakers in this illustrative example.

As shown in this view, conductive elements 1602 electrically couple at least one of the plurality of light sources from the plurality of light sources 1610, audio system 1612, or a combination thereof to a power source. Conductive elements 1602 are used to power at least one of plurality of light sources 1610 and audio system 1612 in this illustrative example.

Figure 17:
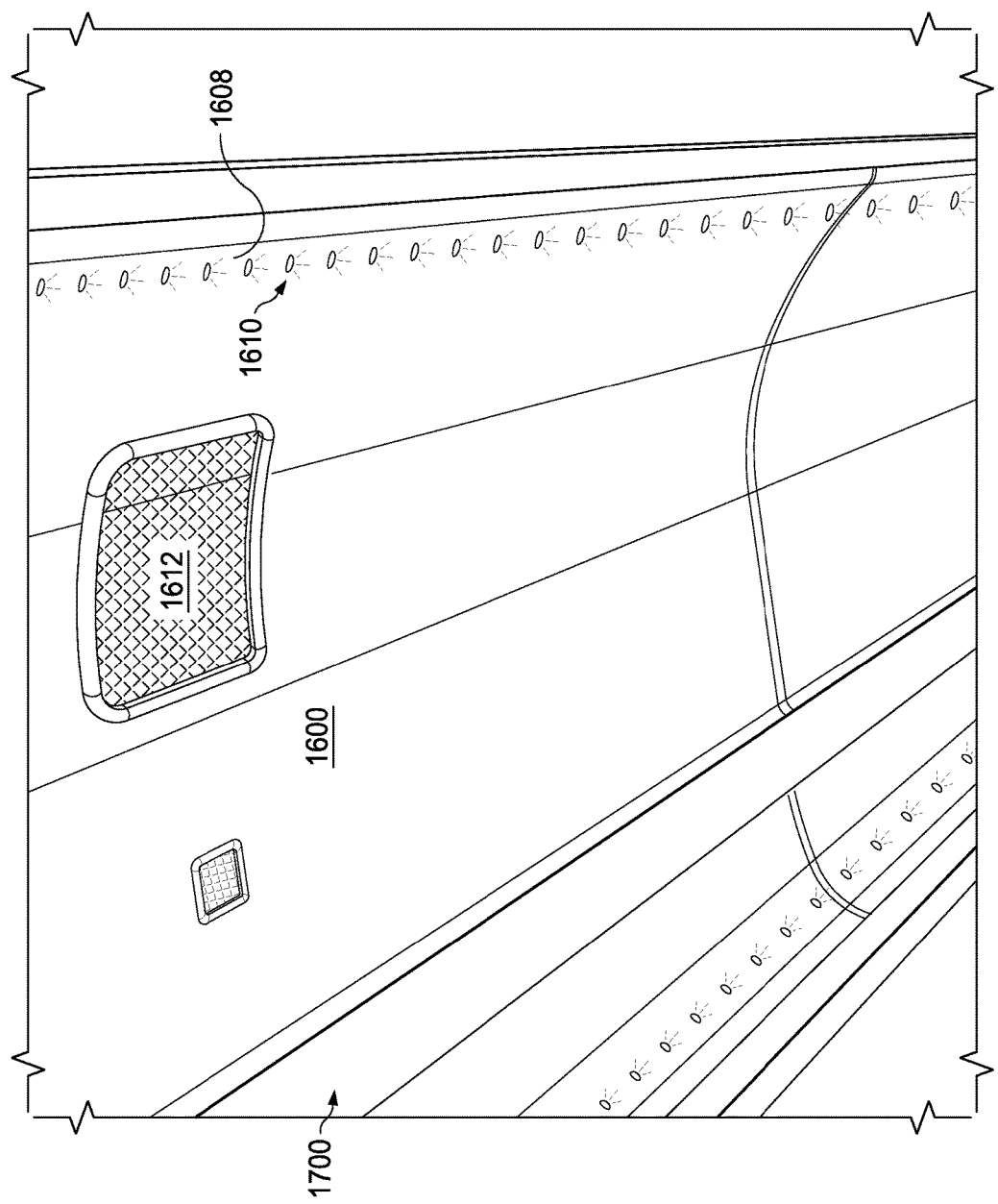
FIG. 17 is an illustration of an interior panel installed in an aircraft in accordance with an illustrative embodiment.

FIG. 17 shows an illustration of an interior panel installed in an aircraft in accordance with an illustrative embodiment. Interior panel 1600 from FIG. 16 has been installed in cabin 1700. Cabin 1700 is located in the interior of aircraft 100 shown in FIG. 1. Plurality of light sources 1610 illuminate a portion of cabin 1700.

In this instance, plurality of light sources 1610 provide track lighting for passengers in aircraft 100. Illumination of plurality of light sources 1610 is provided using power supplied by conductive elements 1602. Audio system 1612 provides sound for passengers in cabin 1700, using power supplied by conductive elements 1602.

The illustrations of electronic devices, conductive elements, and manufacturing processes shown in FIGS. 4-17 are not meant to imply physical or architectural limitations to the manner in which an illustrative embodiment may be implemented. Other components in addition to or in place of the ones illustrated may be used. Some components may be optional.

The different components shown in FIGS. 4-17 may be illustrative examples of how components shown in block form in FIGS. 2-3 can be implemented as physical structures. Additionally, some of the components in FIGS. 4-17 may be combined with components in FIGS. 2-3, used with components in FIG. 2-3, or a combination of the two.

Further, although electronic device 600 and electronic device 1100 are shown and described as providing power to illumination devices, each of these devices may be configured to provide power to various other types of devices. For instance, electronic device 600 may power a sensor located on wing 104.

As another example, electronic device 1100 may power a control surface located on vertical stabilizer 118. Each of these electronic devices also may power multiple units in some illustrative examples.

Figure 18:
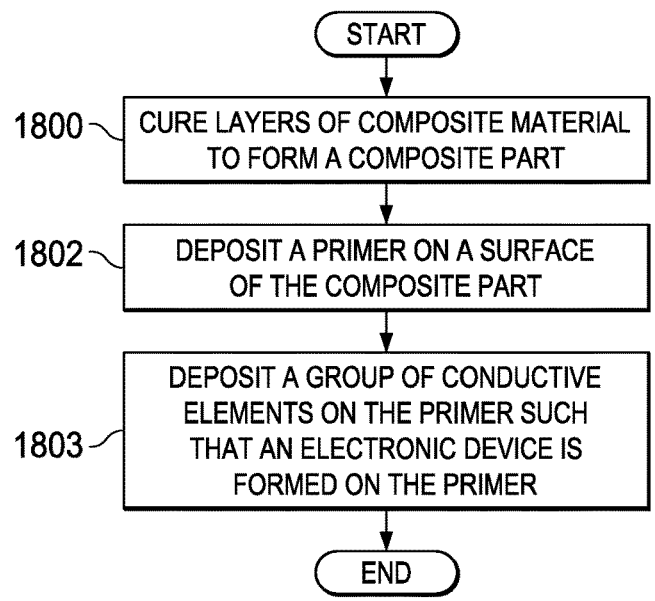
FIG. 18 is an illustration of a flowchart of a process for manufacturing a composite part in accordance with an illustrative embodiment.

With reference now to FIG. 18, an illustration of a flowchart of a process for manufacturing a composite part is depicted in accordance with an illustrative embodiment. The process illustrated in FIG. 18 may be implemented in manufacturing environment 200 in FIG. 2. The different operations may be implemented to form wiring system 202 in FIG. 2.

The process begins by curing layers of composite material to form a composite part (operation 1800). Next, the process deposits a primer on a surface of the composite part (operation 1802). A group of conductive elements is then deposited on the primer such that an electronic device is formed on the primer (operation 1803) with the process terminating thereafter.

Figure 19:
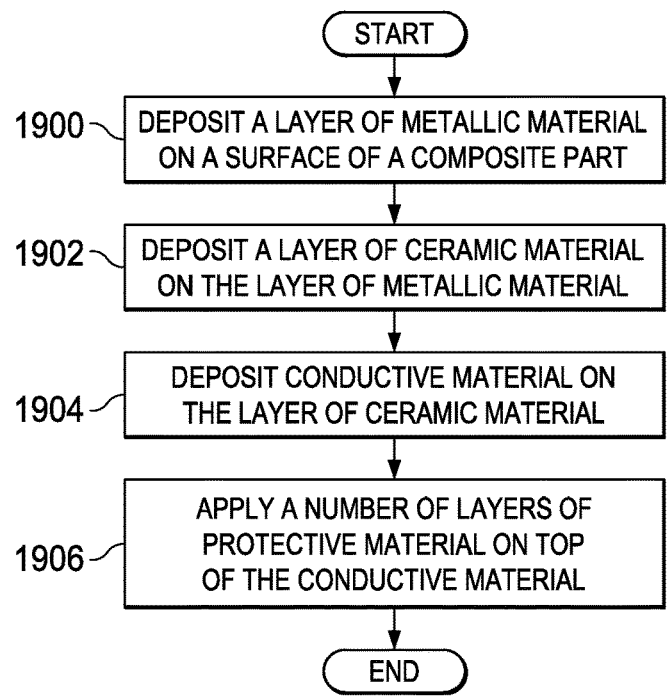
FIG. 19 is an illustration of a flowchart of a process for forming an electronic device on a composite part in accordance with an illustrative embodiment.

Referring next to FIG. 19, an illustration of a flowchart of a process for forming an electronic device on a composite part is depicted in accordance with an illustrative embodiment. The process illustrated in FIG. 19 may be implemented in manufacturing environment 200 by deposition system 230 to form wiring system 202 in FIG. 2.

The process begins by depositing a layer of metallic material on the surface of the composite part (operation 1900). As an example, a layer of metallic material may be sprayed on directly on the surface of the composite part using a thermal plasma spray.

Next, the process deposits a layer of ceramic material on the layer of metallic material (operation 1902). This layer of ceramic material also may be sprayed on using a thermal plasma spray. Optionally, a number of additional layers of material, such as dielectric material, may be applied to at least one of the surface of the composite part, the layer of metallic material, or the layer of ceramic material.

Thereafter, the process deposits conductive material on the layer of ceramic material (operation 1904). As an example, the conductive material may be sprayed on the layer of ceramic material using a thermal plasma spray to form the group of conductive elements.

The process then applies a number of layers of protective material on top of the conductive material (operation 1906), with the process terminating thereafter. The composite part is now ready for inspection and installation in the aircraft.

Figure 20:
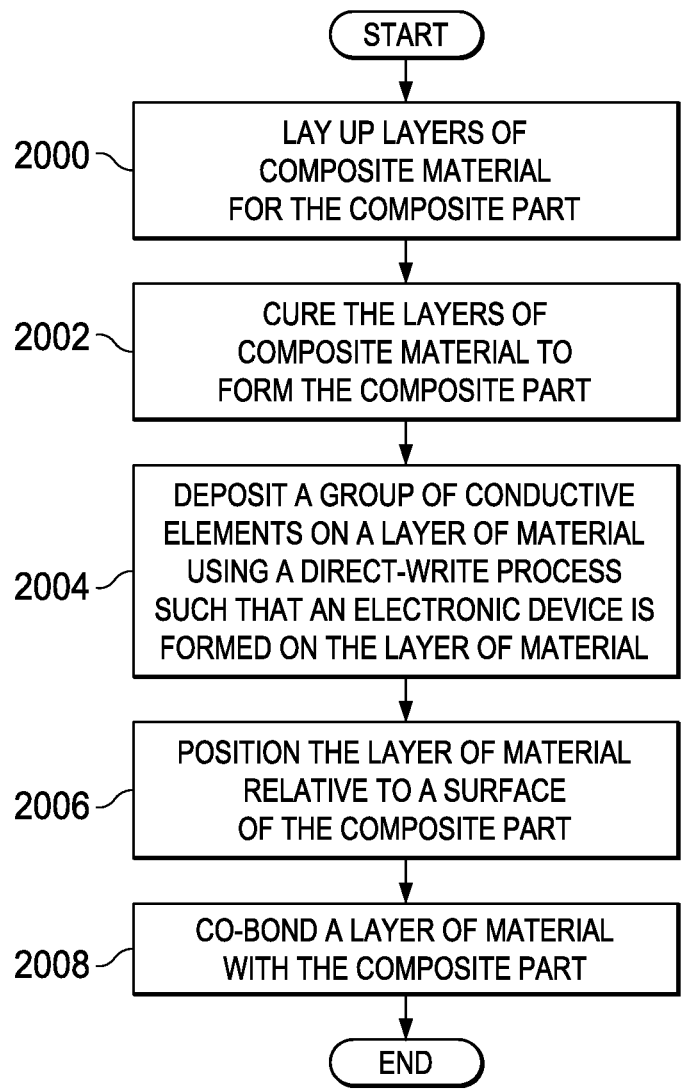
FIG. 20 is an illustration of a flowchart of a process for manufacturing a composite part in accordance with an illustrative embodiment.

In FIG. 20, an illustration of a flowchart of a process for manufacturing a composite part is depicted in accordance with an illustrative embodiment. The process illustrated in FIG. 20 may be implemented in manufacturing environment 200 in FIG. 2. The different operations may be implemented to form wiring system 202.

The process begins by laying up layers of composite material for the composite part (operation 2000). Next, the process cures the layers of composite material to form the composite part (operation 2002).

Thereafter, the process deposits a group of conductive elements on a layer of material using a direct-write process such that an electronic device is formed on the layer of material (operation 2004). The process then positions the layer of material relative to a surface of the composite part (operation 2006).

Next, the process co-bonds a layer of material with the composite part (operation 2008) with the process terminating thereafter. The conductive elements may now be used to supply power to various devices connected to the composite part.

The flowcharts and block diagrams in the different depicted embodiments illustrate the architecture, functionality, and operation of some possible implementations of apparatuses and methods in an illustrative embodiment. In this regard, each block in the flowcharts or block diagrams may represent at least one of module, a segment, a function, or a portion a combination thereof of an operation or step.

In some alternative implementations of an illustrative embodiment, the function or functions noted in the blocks may occur out of the order noted in the figures. For example, in some cases, two blocks shown in succession may be executed substantially concurrently, or the blocks may sometimes be performed in the reverse order, depending upon the functionality involved. Also, other blocks may be added in addition to the illustrated blocks in a flowchart or block diagram.

Illustrative embodiments of the disclosure may be described in the context of aircraft manufacturing and service method 2100 as shown in FIG. 21 and aircraft 2200 as shown in FIG. 22. Turning first to FIG. 21, an illustration of an aircraft manufacturing and service method is depicted in the form of a block diagram in accordance with an illustrative embodiment. During pre-production, aircraft manufacturing and service method 2100 may include specification and design 2102 of aircraft 2200 in FIG. 22 and material procurement 2104.

During production, component and subassembly manufacturing 2106 and system integration 2108 of aircraft 2200 in FIG. 22 takes place. Thereafter, aircraft 2200 in FIG. 22 may go through certification and delivery 2110 in order to be placed in service 2112. While in service 2112 by a customer, aircraft 2200 in FIG. 22 is scheduled for routine maintenance and service 2114, which may include modification, reconfiguration, refurbishment, and other maintenance or service.

Each of the processes of aircraft manufacturing and service method 2100 may be performed or carried out by a system integrator, a third party, an operator, or a combination thereof. In these examples, the operator may be a customer. For the purposes of this description, a system integrator may include, without limitation, any number of aircraft manufacturers and major-system subcontractors; a third party may include, without limitation, any number of vendors, subcontractors, and suppliers; and an operator may be an airline, a leasing company, a military entity, a service organization, and so on.

With reference now to FIG. 22, an illustration of an aircraft is depicted in the form of a block diagram in which an illustrative embodiment may be implemented. In this example, aircraft 2200 is produced by aircraft manufacturing and service method 2100 in FIG. 21 and may include airframe 2202 with plurality of systems 2204 and interior 2206. Examples of systems 2204 include one or more of propulsion system 2208, electrical system 2210, hydraulic system 2212, and environmental system 2214. Any number of other systems may be included. Although an aerospace example is shown, different illustrative embodiments may be applied to other industries, such as the automotive industry.

Apparatuses and methods embodied herein may be employed during at least one of the stages of aircraft manufacturing and service method 2100 in FIG. 21. In particular, wiring system 202 from FIGS. 2-3 may be formed during component and subassembly manufacturing 2106. For instance, group of conductive elements 224 may be deposited on surface 222 of composite part 212 used in aircraft 2200 during component and subassembly manufacturing 2106.

As another example, layer of material 300 and composite part 212 may be co-bonded during component and subassembly manufacturing 2106. In yet another illustrative example, wiring system 202 may be installed in aircraft 2200 during system integration 2108, routine maintenance and service 2114, or some other stage of aircraft manufacturing and service method 2100.

In one illustrative example, components or subassemblies produced in component and subassembly manufacturing 2106 in FIG. 21 may be fabricated or manufactured in a manner similar to components or subassemblies produced while aircraft 2200 is in service 2112 in FIG. 21. As yet another example, one or more apparatus embodiments, method embodiments, or a combination thereof may be utilized during production stages, such as component and subassembly manufacturing 2106 and system integration 2108 in FIG. 21. One or more apparatus embodiments, method embodiments, or a combination thereof may be utilized while aircraft 2200 is in service 2112, during maintenance and service 2114 in FIG. 21, or a combination thereof. The use of a number of the different illustrative embodiments may substantially expedite the assembly, reduce the cost of aircraft 2200, or both.

Thus, the illustrative embodiments provide a method and apparatus for manufacturing composite part 212 with group of conductive elements 224. Composite part 212 with conductive elements 224 form wiring system 202. In an illustrative embodiment, layers of composite material 216 are cured to form composite part 212. Primer 221 with layer of metallic material 223 and layer of ceramic material 225 are deposited on surface 222 of composite part 212. Group of conductive elements 224 is deposited on primer 221 such that electronic device 214 is formed on primer 221 on surface 222 of composite part 212. In another illustrative embodiment, after curing and trimming, composite part 212, layer of material 300 having group of conductive elements 224 is co-bonded with composite part 212. Both embodiments provide a means to supply power 206 from power source 207 to device 208 in this illustrative example.

With the use of an illustrative embodiment, a wiring system for an aircraft may be integrated into a composite part. The process for depositing conductive elements onto the part may be automated using a direct-write process. The direct-write process allows deposition of conductive elements to occur upstream in the manufacturing process without the need for etching or other time-consuming post-processing steps. As a result, the time needed to manufacture wiring systems for aircraft may be reduced.

The illustrative embodiments also reduce the time needed to install wiring systems in aircraft. Instead of manufacturing each physical wiring component, assembling those components into wire bundles, and installing the wire bundles in the aircraft, the use of an illustrative embodiment allows operators to bypass those steps for some composite structures.

In some cases, a wiring system in accordance with an illustrative embodiment may be used throughout the aircraft. In other cases, such a system may be used in conjunction with existing wiring systems using wire bundles. The reduction in labor hours results in a reduction in cost to manufacture the aircraft. Moreover, the illustrative embodiments establish a reliable and repeatable process for depositing conductive elements on a composite structure.

In addition, when conductive elements are deposited on composite aircraft parts, significant weight savings are realized. The need for accessory structures, such as ties, clamps, and brackets, among others, is reduced. As a result, the use of an illustrative embodiment decreases the weight of the aircraft. This decrease in weight may increase the aerodynamic performance of the aircraft.

The illustrative embodiments also aid in ensuring the structural integrity of composite aircraft parts. Instead of drilling holes, countersinking those holes, and installing fasteners, electronic devices are formed on the composite part without damaging the structure. In this manner, inspection of each hole for cracks, delamination, and other inconsistencies can be reduced or eliminated, resulting in additional time and cost savings.

The description of the different illustrative embodiments has been presented for purposes of illustration and description, and is not intended to be exhaustive or limited to the embodiments in the form disclosed. Many modifications and variations will be apparent to those of ordinary skill in the art. Further, different illustrative embodiments may provide different features as compared to other desirable embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. A method for manufacturing a composite part comprising:
   curing layers of composite material to form the composite part;
   depositing a primer on a surface of the composite part; and
   forming a group of conductive elements on the primer such that an electronic device is formed on the composite part by using a direct-write process to deposit a conductive material directly onto the primer deposited on the surface of the composite part.

2. The method of claim 1, wherein depositing the primer on the surface of the composite part comprises:
   depositing a layer of metallic material on the surface of the composite part; and
   depositing a layer of ceramic material on the layer of metallic material.

3. The method of claim 2, wherein depositing the primer on the surface of the composite part comprises:
   spraying the layer of metallic material on the surface of the composite part using a thermal plasma spray; and
   spraying the layer of ceramic material on the layer of metallic material using the thermal plasma spray.

4. The method of claim 3, wherein depositing the conductive material to form the group of conductive elements comprises:
   spraying the conductive material on the layer of ceramic material using the thermal plasma spray to form the group of conductive elements.

5. The method of claim 1, wherein depositing the conductive material to form the group of conductive elements on the primer comprises:
   depositing conductive traces on the primer extending from one end of the composite part to another end of the composite part to form a power rail for supplying power across the composite part to power at least one connected device.

6. The method of claim 1, wherein the direct-write process is selected from one of a thermal plasma spray, a nanoparticle ink-jet process, screen-printing, an atomized jetted ink process, and kinetic metallization.

7. The method of claim 1, wherein depositing the primer on the surface of the composite part comprises:
   applying a number of layers of dielectric material to the surface of the composite part prior to depositing the conductive material to form the group of conductive elements.

8. The method of claim 1 further comprising:
   applying a number of layers of protective material on top of the group of conductive elements.

9. The method of claim 1, wherein the group of conductive elements comprises:
   at least one of an electrical trace, an interconnect, a wire, a transistor, an integrated circuit, or a conductive connector.

10. The method of claim 1, wherein the composite part is an aircraft part.

11. The method of claim 1, further comprising providing power from a power source through the group of conductive elements to a device connected to the composite part, wherein the device connected to the composite part is selected from the group of devices configured to use the power to perform operations consisting of a light, an appliance, a control system, a sensor, a display device, a computer, a field replaceable unit, an inflight entertainment system, a graphical indicator, a beacon, an emergency device, a door system, and an audio system.

* * * * *